(12) United States Patent
Shih et al.

(10) Patent No.: US 12,374,631 B2
(45) Date of Patent: *Jul. 29, 2025

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Hsu-Chiang Shih, Kaohsiung (TW); Hung-Yi Lin, Kaohsiung (TW); Meng-Wei Hsieh, Kaohsiung (TW); Yu Sheng Chang, Kaohsiung (TW); Hsiu-Chi Liu, Kaohsiung (TW); Mark Gerber, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 468 days.

This patent is subject to a terminal disclaimer.

(21) Appl. No.: 17/752,795

(22) Filed: May 24, 2022

(65) Prior Publication Data

US 2022/0359425 A1 Nov. 10, 2022

Related U.S. Application Data

(63) Continuation of application No. 16/798,170, filed on Feb. 21, 2020, now Pat. No. 11,342,282.

(51) Int. Cl.
*H01L 23/00* (2006.01)
*H01L 21/56* (2006.01)
(Continued)

(52) U.S. Cl.
CPC .......... *H01L 23/562* (2013.01); *H01L 21/561* (2013.01); *H01L 23/481* (2013.01); *H01L 23/528* (2013.01); *H01L 24/94* (2013.01)

(58) Field of Classification Search
CPC ... H01L 23/562; H01L 21/561; H01L 23/481; H01L 23/528; H01L 24/94; H01L 24/20;
(Continued)

(56) References Cited

U.S. PATENT DOCUMENTS 11,342,282 B2 * 5/2022 Shih .................. H01L 23/562
2005/0116345 A1 6/2005 Murtuza
(Continued)

OTHER PUBLICATIONS

Non-Final Office Action for U.S. Appl. No. 16/798,170, issued Aug. 5, 2021, 23 pages.
(Continued)

*Primary Examiner* — Herve-Louis Y Assouman
(74) *Attorney, Agent, or Firm* — FOLEY & LARDNER LLP

(57) ABSTRACT

A semiconductor device package includes an electronic component, an electrical contact and a reinforcement layer. The electronic component has a first conductive layer on a first surface of the electronic component. The electronic component has a through-silicon-via (TSV) penetrating the electronic component and electrically connected to the first conductive layer. The electrical contact is disposed on the first surface of the electronic component and electrically connected to the first conductive layer. The reinforcement layer is disposed on the first surface of the electronic component.

14 Claims, 44 Drawing Sheets

(51) Int. Cl.
*H01L 21/683* (2006.01)
*H01L 23/31* (2006.01)
*H01L 23/48* (2006.01)
*H01L 23/498* (2006.01)
*H01L 23/528* (2006.01)

(58) Field of Classification Search
CPC . H01L 2221/68327; H01L 2224/04105; H01L 2224/12105; H01L 2224/16145; H01L 2224/73209; H01L 2224/73259; H01L 21/568; H01L 21/6836; H01L 23/3128; H01L 24/18; H01L 23/49816
See application file for complete search history.

(56) References Cited

U.S. PATENT DOCUMENTS

| | | |
|---|---|---|
| 2009/0302435 A1 | 12/2009 | Pagaila et al. |
| 2010/0193928 A1 | 8/2010 | Zudock et al. |
| 2011/0045634 A1 | 2/2011 | Pagaila |
| 2012/0032340 A1 | 2/2012 | Choi et al. |
| 2012/0056312 A1 | 3/2012 | Pagaila et al. |
| 2012/0153493 A1* | 6/2012 | Lee ............ H01L 24/24 257/774 |
| 2013/0200528 A1 | 8/2013 | Lin et al. |
| 2013/0341784 A1 | 12/2013 | Lin et al. |
| 2014/0070422 A1* | 3/2014 | Hsiao ............ H01L 21/4857 438/618 |
| 2014/0091454 A1 | 4/2014 | Lin et al. |
| 2017/0125355 A1 | 5/2017 | Su et al. |
| 2017/0357838 A1* | 12/2017 | Chen ............ G06V 40/1306 |
| 2019/0139860 A1* | 5/2019 | Wu ............ H01L 21/486 |

OTHER PUBLICATIONS

Notice of Allowance for U.S. Appl. No. 16/798,170, issued, Jan. 26, 2022, 8 pages.

\* cited by examiner

SEMICONDUCTOR DEVICE PACKAGE AND METHOD OF MANUFACTURING THE SAME

CROSS-REFERENCE TO RELATED APPLICATIONS

This application is a continuation of U.S. patent application Ser. No. 16/798,170 filed Feb. 21, 2020, now issued as U.S. Pat. No. 11,342,282, the contents of which is incorporated herein by reference in its entirety.

BACKGROUND

1. Field of the Disclosure

The present disclosure relates to a semiconductor device package and a method of manufacturing the same, and to a semiconductor device package having a reinforcement structure and a method of manufacturing the same.

2. Description of the Related Art

Along with the rapid development in electronics industry and the progress of semiconductor processing technologies, many electronic components (e.g., chips or dices) may be integrated into a single package to achieve better electrical performance and more functions. However, as the thicknesses of electronic components reduce, the structural strength of the electronic components may decrease. Hence, the stress during the manufacturing process may damage the electronic components, which would decrease the yield of the electronic components.

SUMMARY

In some embodiments, a semiconductor device package includes an electronic component, an electrical contact and a reinforcement layer. The electronic component has a first conductive layer on a first surface of the electronic component. The electronic component has a through-silicon-via (TSV) penetrating the electronic component and electrically connected to the first conductive layer. The electrical contact is disposed on the first surface of the electronic component and electrically connected to the first conductive layer. The reinforcement layer is disposed on the first surface of the electronic component.

In some embodiments, a semiconductor device package includes a first electronic component, a second electronic component, an electrical contact and a reinforcement layer. The first electronic component has an active surface. The second electronic component is connected to the active surface of the first electronic component. The second electronic component has a first surface facing away from the first electronic component. A width of the second electronic component is smaller than a width of the first electronic component. The electrical contact is disposed on the first surface of the second electronic component. The reinforcement layer is disposed on the first surface of the second electronic component.

In some embodiments, a method of manufacturing a semiconductor device package includes (a) providing a plurality of first electronic components each having a TSV fully penetrating the first electronic component; (b) forming an electrical contact on a first surface of each first electronic component; (c) forming a reinforcement layer on the first surface of each first electronic component; and (d) performing a singulation operation to separate out individual first electronic components.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

FIG. 1B, FIG. 1C, FIG. 1D, FIG. 1E, FIG. 1F, FIG. 1G, FIG. 1H, FIG. 1I, FIG. 1J, FIG. 1K, FIG. 1L, FIG. 1M, FIG. 1N, FIG. 1O, FIG. 1P, FIG. 1Q and FIG. 1R illustrate cross-sectional views of semiconductor structures in accordance with some embodiments of the present disclosure.

DETAILED DESCRIPTION

Figure 1A:
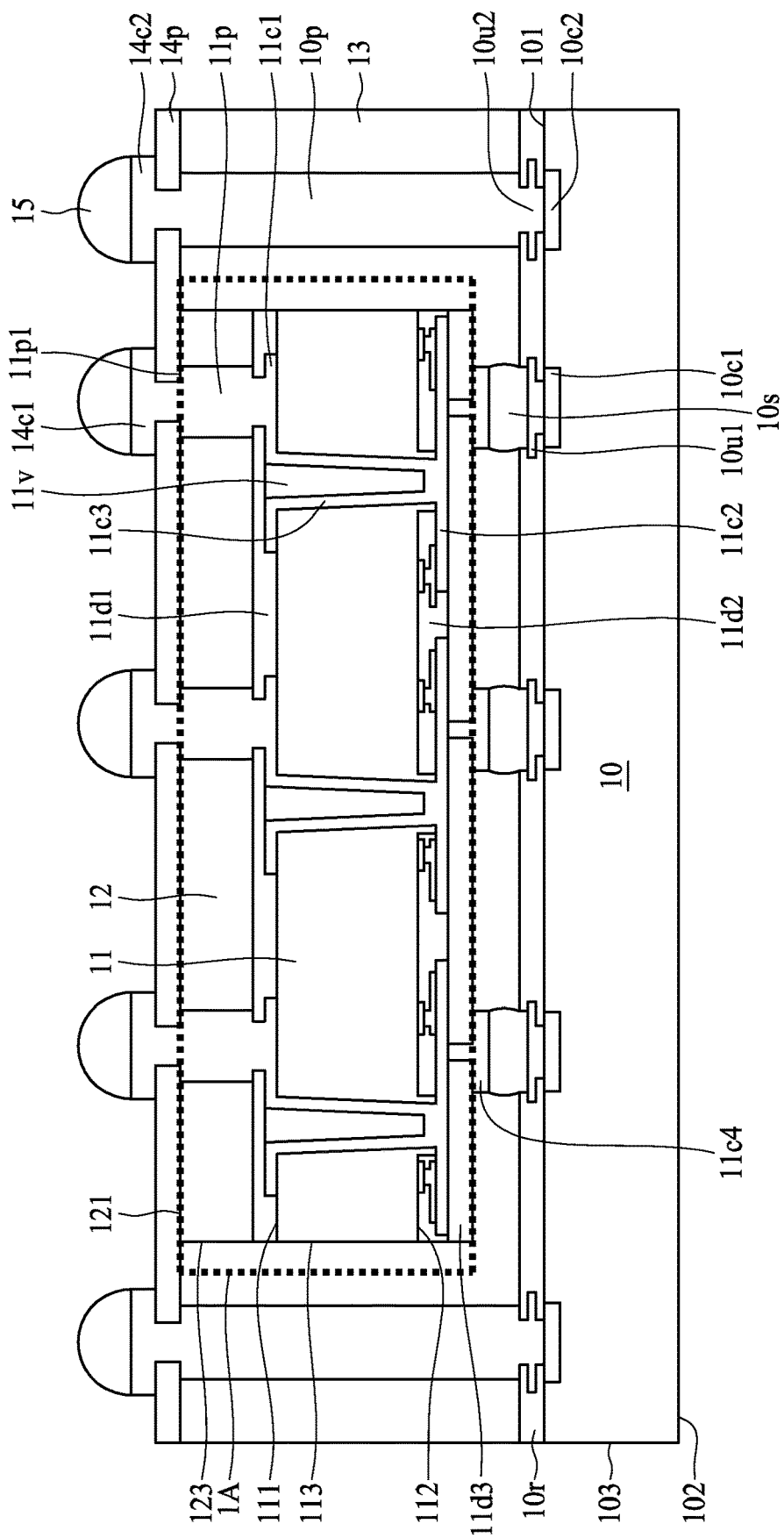
FIG. 1A illustrates a cross-sectional view of a semiconductor device package in accordance with some embodiments of the present disclosure.

FIG. 1A illustrates a cross-sectional view of a semiconductor device package 1 according to some embodiments of the present disclosure. The semiconductor device package 1 includes electronic components 10, 11, a reinforcement layer 12, a package body 13 and electrical contacts 15.

The electronic component 10 has an active surface 101, a back surface 102 (also referred to as backside) opposite to the active surface 101 and a lateral surface 103 extending between the active surface 101 and the back surface 102. The electronic component 10 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. In some embodiments, the electronic component 10 may be or include a memory device or any other devices that require high-speed transmission.

The electronic component 10 may include one or more conductive pads 10c1, 10c2 in proximity to, adjacent to, or embedded in and exposed at the active surface 101 of the electronic component 10. A protection layer 10r (e.g., a photoresist, a passivation layer or the like) may be disposed on the active surface 101 of the electronic component 10 to fully expose or to expose at least a portion of the conductive pads 10c1, 10c2 for electrical connections. In some embodiments, conductive layers 10u1, 10u2 (e.g., under bump metallurgy layers (UBM layers)) may be disposed on the conductive pads 10c1, 10c2, and are electrically connected to the exposed portion of the conductive pads 10c1, 10c2. In some embodiments, the electronic component 10 may include a processer, such as an application process (e.g., an application-specific integrated circuit (ASIC)), a central processing unit (CPU), a microcontroller unit (MCU) or any other suitable processors.

The electronic component 11 is disposed on the active surface 101 of the electronic component 10 and electrically connected to the active surface 101 (e.g., to the conductive pad 10c1 and/or conductive layer 10u1) of the electronic component 10 through, for example, electrical contacts 10s. In some embodiments, the electrical contacts 10s may include a controlled collapse chip connection (C4) bump, a ball grid array (BGA) or a land grid array (LGA). The electronic component 11 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. In some embodiments, the electronic component 11 may be or include a memory device or any other devices that require high-speed transmission.

The electronic component 11 has a surface 111 facing away from the electronic component 11, a surface 112 opposite to the surface 111 and a lateral surface 113 extending between the surface 111 and the surface 112. A conductive layer 11c1 (may include redistribution layer (RDL), conductive pads or the like) is disposed on the surface 111 of the electronic component 11. A dielectric layer 11d1 is disposed on the surface 111 of the electronic component 11. The dielectric layer 11d1 covers a portion of the conductive layer 11c1 and exposes the other portion of the conductive layer 11c1 for electrical connections. In some embodiments, the dielectric layers 11d1 may include an organic material, a solder mask, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg fiber may include, but are not limited to, a multi-layer structure formed by stacking or laminating one or more pre-impregnated materials or sheets. In some embodiments, the dielectric layer 11d1 may include an inorganic material, such as silicon, a ceramic or the like. The conductive 11c1 may include, for example, gold (Au), silver (Ag), copper (Cu), nickel (Ni), palladium (Pd), another metal, a solder alloy, or a combination of two or more thereof. In some embodiments, there may be any number of the conductive layer 11c1 depending on different design specifications.

A conductive layer 11c2 (may include RDL, conductive pads or the like) is disposed on the surface 112 of the electronic component 11. A dielectric layer 11d2 is disposed on the surface 112 of the electronic component 11. The dielectric layer 11d2 covers a portion of the conductive layer 11c2 and exposes the other portion of the conductive layer 11c2 for electrical connections. A dielectric layer 11d3 is disposed on the dielectric layer 11d2. The dielectric layer 11d3 covers a portion of the conductive layer 11c2 and exposes the other portion of the conductive layer 11c2 for electrical connections. A conductive layer 11c4 is disposed on a surface of the dielectric layer 11d3 facing the electronic component 10 and extends within the dielectric layer 11d3 to be electrically connected to the conductive layer 11c4. The conductive layer 11c4 is electrically connected to the electrical contacts 10s. In some embodiments, the dielectric layers 11d2, 11d3 and the dielectric layer 11d1 may include the same material. Alternatively, the dielectric layers 11d2, 11d3 and the dielectric layer 11d1 may include different materials. In some embodiments, the conductive layers 11c2, 11c4 and the conductive layer 11c1 may include the same material. Alternatively, the conductive layers 11c2, 11c4 and the conductive layer 11c1 may include different materials. In some embodiments, the conductive layers 11c1, 11c2 may be the input/output (I/O) terminals (e.g., pins) of the electronic component 11.

In some embodiments, the electronic component 11 may include one or more through holes 11v fully penetrating the electronic component 11. For example, the through hole 11v may extend from the surface 111 of the electronic component 11 to the surface 112 of the electronic component 11. A conductive via 11c3 (e.g., through-silicon-via (TSV)) is disposed on sidewalls of the through hole 11v and electrically connected to the conductive layer 11c1 and the conductive layer 11c2. For example, the conductive layer 11c1 and the conductive layer 11c2 are electrically connected through the conductive via 11c3. In some embodiments, an insulation material (e.g., a dielectric material such as polymer or the like) may be disposed within the through hole 11v. The dielectric material is surrounded by the conductive via 11c3. The dielectric material is in contact with the conducive via 11c3. In some embodiments, the electronic component 11 may include a capacitor. In some embodiments, the capacitor may store a small amount of energy that can compensate the voltage drop caused by the resistance in the power supply conductors (e.g., an external power supply, such as an external current supply or an external voltage supply). In some embodiments, the electronic component 11 may include conductive trenches or deep trenches to form a portion of the capacitor (e.g., a deep trench capacitor). In some embodiments, the electronic component 11 may include a decoupling capacitor.

Electrical contacts 11p are disposed on the portion of conductive layer 11c1 exposed from the dielectric layer 11d1 and electrically connected to the conductive layer 11c1. In some embodiments, the electrical contacts 11p may be or include conductive pillars, solder balls or any other suitable connection structures. In some embodiments, a number of the electrical contact 11p is the same as a number of the electrical contact 10s. Alternatively, the number of the electrical contact 11p is different from the number of the electrical contact 10s.

The reinforcement layer 12 is disposed on the dielectric layer 11d1 and covers the electrical contacts 11p. In some embodiments, the reinforcement layer 12 fully surrounds the electrical contacts 11p. For example, the reinforcement layer 12 is in contact with lateral surfaces of the electrical contacts 11p. A top surface 11p1 of the electrical contact 11p is exposed from the reinforcement layer 12 for electrical connections. In some embodiments, a top surface 121 of the reinforcement layer 11 is substantially coplanar with the top surface 11p1 of the electrical contacts 11p.

In some embodiments, the reinforcement layer 12 may be or include a package body. In some embodiments, the package body includes an epoxy resin having fillers, a molding compound (e.g., an epoxy molding compound or other molding compound), a polyimide, a phenolic compound or material, a material with a silicone dispersed therein, or a combination thereof. In some embodiments, a lateral surface 123 of the reinforcement layer 12 is substantially coplanar with the lateral surface 113 of the electronic component 11.

Conductive pillars 10p are disposed on the active surface 101 of the electronic component 10 and electrically connected to the active surface 101 (e.g., to the conductive pad 10c2 and/or conductive layer 10u2) of the electronic component 10. The conductive pillars 10p may provide electrical connections between the electronic component 10 and external devices. In some embodiments, the electrical connections between the electronic component 10 and external devices may be achieved by the conductive pillars 10p and the electronic component 11. In some embodiments, a height of the conductive pillars 10p is less than 110 micrometers.

The package body 13 is disposed on the active surface 101 of the electronic component 10. The package body 13 covers the conductive pillars 10p, the electrical contacts 10s, the electronic component 11 (e.g., the lateral surface 113 of the electronic component 11) and the reinforcement layer 12 (e.g., the lateral surface 123 of the reinforcement layer 12). In some embodiments, the top surface 121 of the reinforcement layer 12 and the top surface 11p1 of the electrical contacts 11p are exposed from the package body 13. In some embodiments, the package body 13 includes an epoxy resin having fillers, a molding compound (e.g., an epoxy molding compound or other molding compound), a polyimide, a phenolic compound or material, a material with a silicone dispersed therein, or a combination thereof. In some embodiments, the reinforcement layer 12 and the package body 13 include the same material. Alternatively, the reinforcement layer 12 and the package body 13 may include different materials. In some embodiments, there may be a boundary between the reinforcement layer 12 and the package body 13.

Conductive layers 14c1, 14c2 (may include RDL, conductive pads or the like) are disposed on the package body 13. The conductive layer 14c1 is electrically connected to the top surface 11p1 of the electrical contacts 11p exposed from the reinforcement layer 12. The conductive layer 14c2 is electrically connected to a top surface of the conductive pillar 10p exposed from the package body 13. A dielectric layer 14p covers a portion of the conductive layers 14c1, 14c2 and exposes the other portion of the conductive layers 14c1, 14c2 for electrical connections. In some embodiments, the dielectric layer 11d2 and the dielectric layer 11d1 may include the same material.

The electrical contacts 15 are disposed on the conductive layers 14c1, 14c2 exposed from the dielectric layer 14p. In some embodiments, the electrical contacts 15 may include a C4 bump, a BGA or a LGA.

In some embodiments, a thickness of the electronic component 11 is less than 150 micrometers. For example, the thickness of the electronic component 11 is less than 100 micrometers. As the thickness of electronic component 11 reduces, the structural strength of the electronic component 11 may decrease. In addition, the electronic component 11 has one or more through holes 11v to penetrate the electronic component 11, which would further decrease the structural strength of the electronic component 11. Hence, the stress during the manufacturing process may damage the electronic component 11 (e.g., crack), which would decrease the yield for manufacturing the semiconductor device package 1.

In accordance with the embodiments as shown in FIG. 1A, the reinforcement layer 12 is disposed on the surface 111 of the electronic component 11, which may act as a stress buffer layer for the electronic component 11. For example, the stress applied to the electronic component 11 and/or the electrical contacts 11p during the manufacturing process may be absorbed, relieved or dispersed by the reinforcement layer 12. In addition, the reinforcement layer 12 can further increase the structural strength of the electronic component 11. This can prevent the electronic component 11 from being damaged during the manufacturing process and increase the yield for manufacturing the semiconductor device package 1.

Figure 1B:
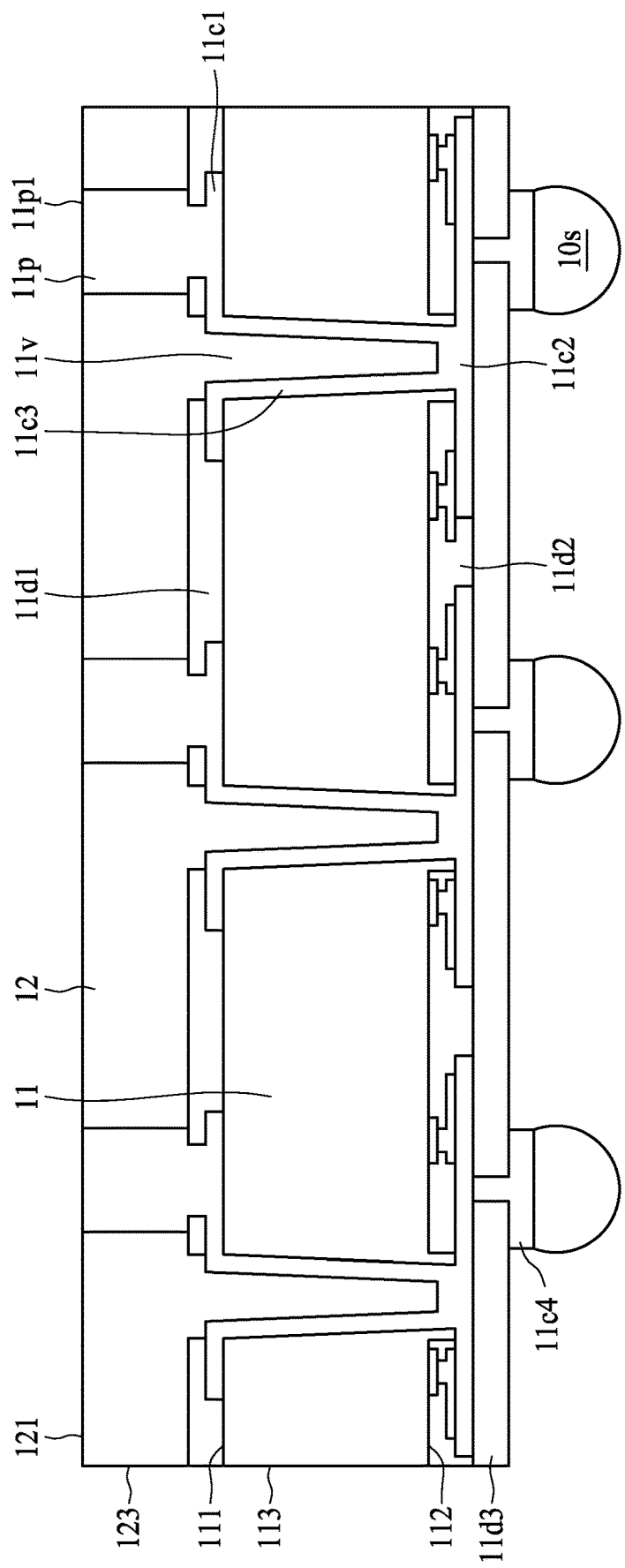

FIG. 1B illustrates a cross-sectional view of a semiconductor structure in accordance with some embodiments of the present disclosure. In some embodiments, the semiconductor structure illustrated in FIG. 1B may be implemented or used for the semiconductor device package 1 as shown in FIG. 1A. For example, a portion of the semiconductor device package 1 encircled by a dotted-line square 1A as shown in FIG. 1A may be replaced by the semiconductor structure as shown in FIG. 1B. The semiconductor structure as shown in FIG. 1B is similar to the portion of the semiconductor device package 1 encircled by a dotted-line square 1A as shown in FIG. 1A, and some of the differences therebetween are described below.

As shown in FIG. 1B, the reinforcement layer 12 further extends within the through holes 11v. For example, the reinforcement layer 12 is disposed within the through holes 11v and surrounded by the conductive via 11c3. The reinforcement layer 12 within the through holes 11v is in contact with the conducive via 11c3.

Figure 1C:
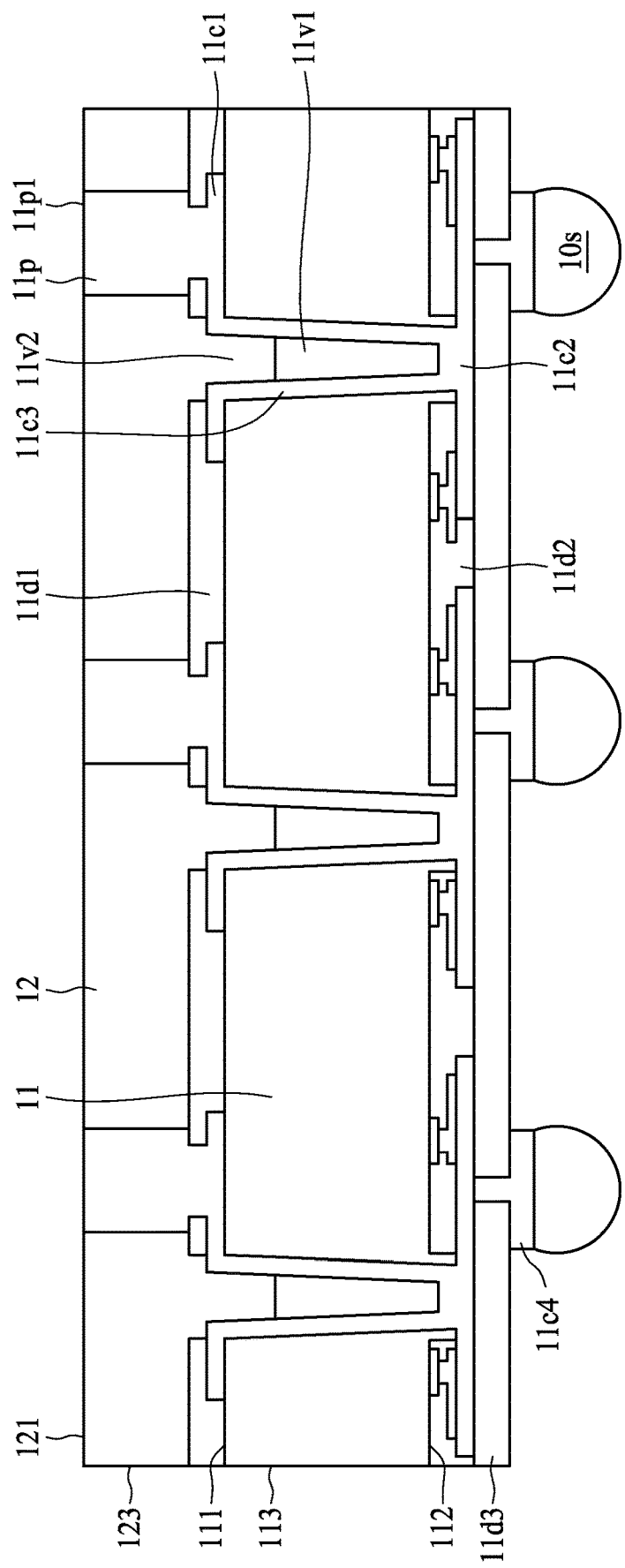

FIG. 1C illustrates a cross-sectional view of a semiconductor structure in accordance with some embodiments of the present disclosure. In some embodiments, the semiconductor structure illustrated in FIG. 1C may be implemented or used for the semiconductor device package 1 as shown in FIG. 1A. For example, a portion of the semiconductor device package 1 encircled by a dotted-line square 1A as shown in FIG. 1A may be replaced by the semiconductor structure as shown in FIG. 1C. The semiconductor structure as shown in FIG. 1C is similar to the portion of the semiconductor device package 1 encircled by a dotted-line square 1A as shown in FIG. 1A, and some of the differences therebetween are described below.

As shown in FIG. 1C, the through hole 11v may include a portion 11v1 and a portion 11v2 over the portion 11v1 and connected to the portion 11v1. The portion 11v1 is filled with the insulation material as shown in FIG. 1A. The portion 11v2 is filled with the reinforcement layer 12. For example, the reinforcement layer 12 extends within the through hole 11v and in contact with the insulation material within the portion 11v1. In some embodiments, a ratio of a depth of the portion 11v1 to a depth of the portion 11v2 is about 3:2. In accordance with the embodiments as shown in FIG. 1C, by filling the portion 11v1 of the through hole 11v with the insulation material, the structural strength of the electronic component 11 can be enhanced, which can prevent the electronic component 11 from being damaged during the operation for forming the reinforcement layer 12.

Figure 1D:
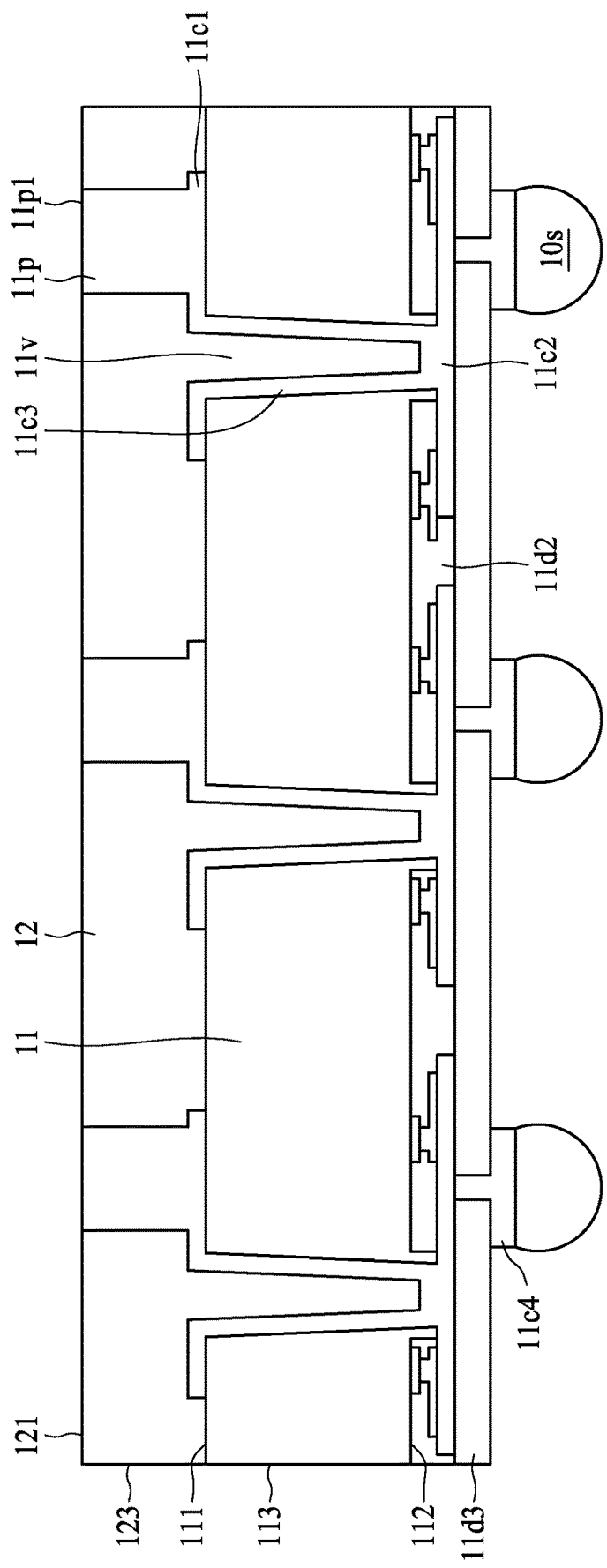

FIG. 1D illustrates a cross-sectional view of a semiconductor structure in accordance with some embodiments of the present disclosure. In some embodiments, the semiconductor structure illustrated in FIG. 1D may be implemented or used for the semiconductor device package 1 as shown in FIG. 1A. For example, a portion of the semiconductor device package 1 encircled by a dotted-line square 1A as shown in FIG. 1A may be replaced by the semiconductor structure as shown in FIG. 1D. The semiconductor structure as shown in FIG. 1D is similar to the semiconductor structure as shown in FIG. 1B, except that in FIG. 1D, the dielectric layer 11*d*1 as shown in FIG. 1B is omitted.

Figure 1E:
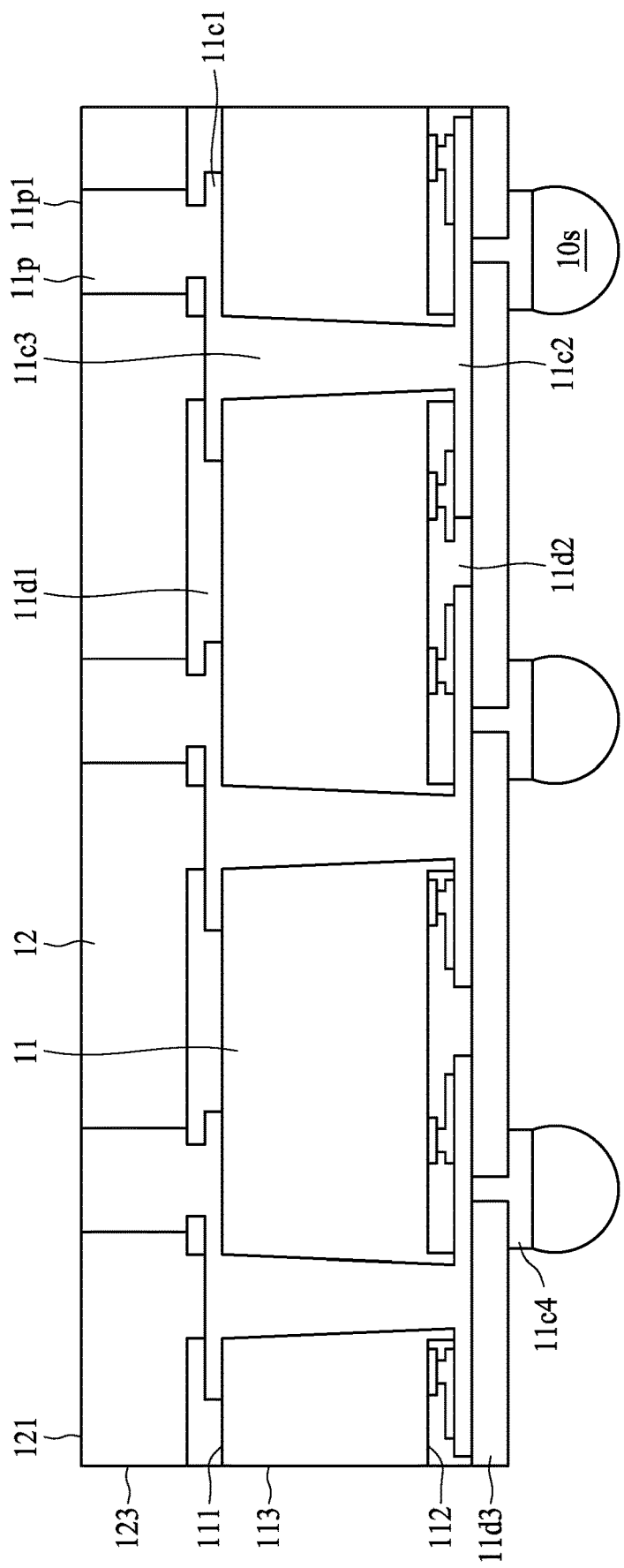

FIG. 1E illustrates a cross-sectional view of a semiconductor structure in accordance with some embodiments of the present disclosure. In some embodiments, the semiconductor structure illustrated in FIG. 1E may be implemented or used for the semiconductor device package 1 as shown in FIG. 1A. For example, a portion of the semiconductor device package 1 encircled by a dotted-line square 1A as shown in FIG. 1A may be replaced by the semiconductor structure as shown in FIG. 1E. The semiconductor structure as shown in FIG. 1E is similar to the portion of the semiconductor device package 1 encircled by a dotted-line square 1A as shown in FIG. 1A, except that as shown in FIG. 1E, the through hole 11*v* is fully filled with the conductive via 11*c*3.

Figure 1F:
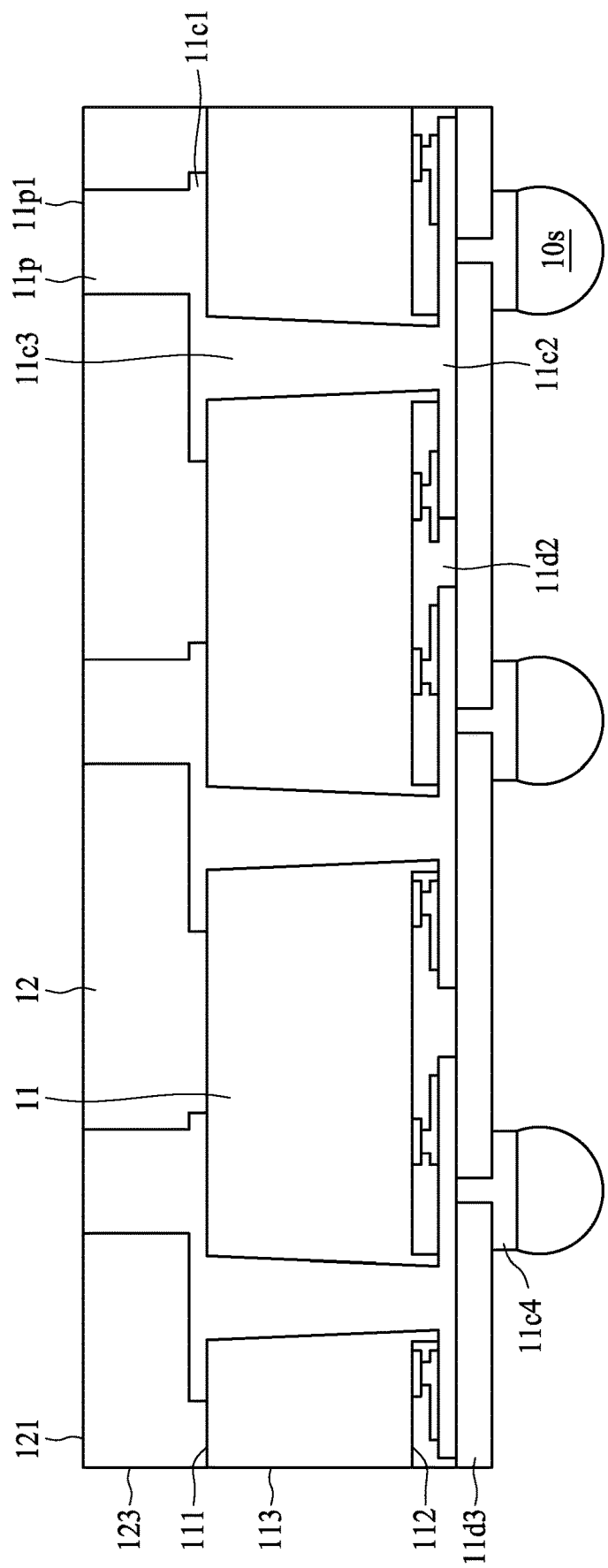

FIG. 1F illustrates a cross-sectional view of a semiconductor structure in accordance with some embodiments of the present disclosure. In some embodiments, the semiconductor structure illustrated in FIG. 1F may be implemented or used for the semiconductor device package 1 as shown in FIG. 1A. For example, a portion of the semiconductor device package 1 encircled by a dotted-line square 1A as shown in FIG. 1A may be replaced by the semiconductor structure as shown in FIG. 1F. The semiconductor structure as shown in FIG. 1F is similar to the semiconductor structure as shown in FIG. 1D, except that as shown in FIG. 1F, the through hole 11*v* is fully filled with the conductive via 11*c*3.

Figure 1G:
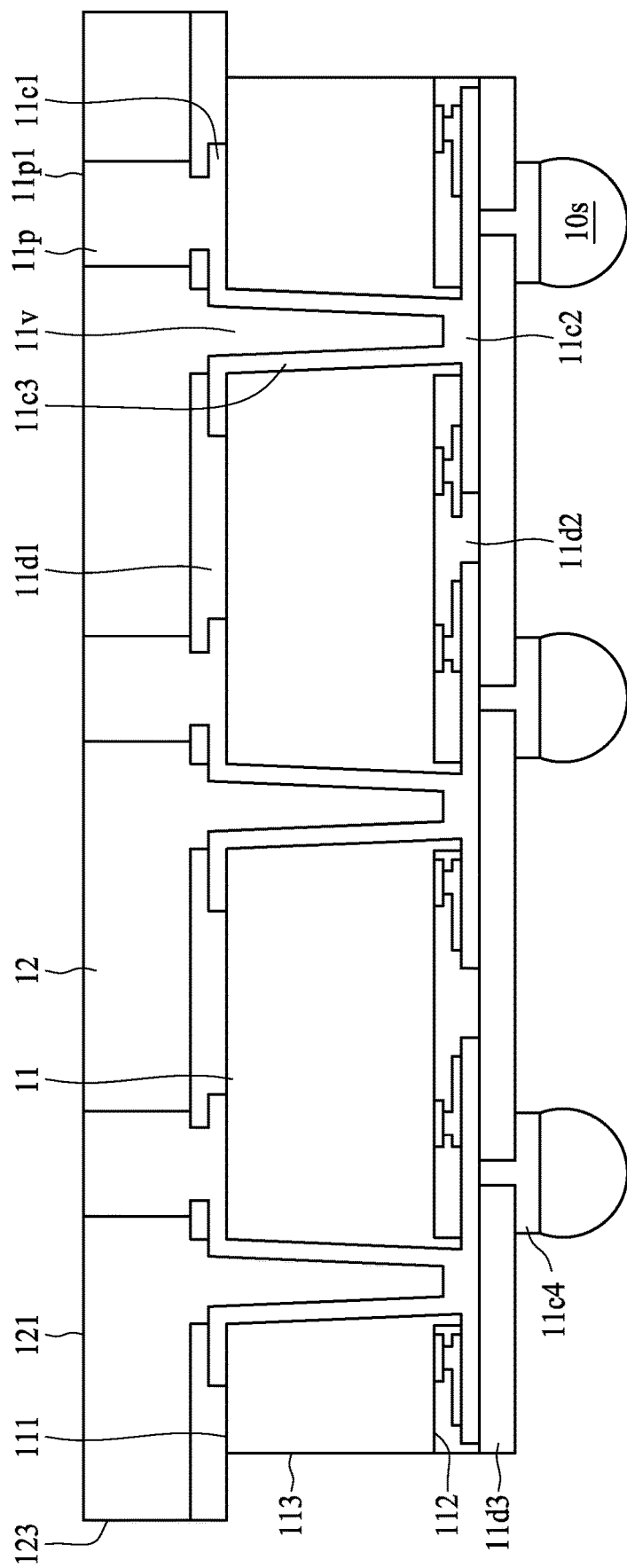

FIG. 1G illustrates a cross-sectional view of a semiconductor structure in accordance with some embodiments of the present disclosure. In some embodiments, the semiconductor structure illustrated in FIG. 1G may be implemented or used for the semiconductor device package 1 as shown in FIG. 1A. For example, a portion of the semiconductor device package 1 encircled by a dotted-line square 1A as shown in FIG. 1A may be replaced by the semiconductor structure as shown in FIG. 1G. The semiconductor structure as shown in FIG. 1G is similar to the semiconductor structure as shown in FIG. 1B, and some of the differences therebetween are described below.

As shown in FIG. 1G, a portion of the electronic component 11 at or near the periphery of the electronic component 11 is removed. A lateral surface 113 of the electronic component 11 is recessed from the lateral surface 123 of the reinforcement layer 12. For example, a width (or an area) of the reinforcement layer 12 is greater than a width (or an area) of the electronic component 11. In some embodiments, the portion of the electronic component 11 may be removed by, for example, plasma, etching, laser or any other suitable operations. Since the portion of the electronic component 11 is at or near the cutting channel (or scribe line), removing the portion of the electronic component 11 allows that the cutting operation (or singulation operation) is carried out merely through the reinforcement layer 12, which can prevent the electronic component 11 from being damaged (e.g., crack) during the singulation operation.

Figure 1H:
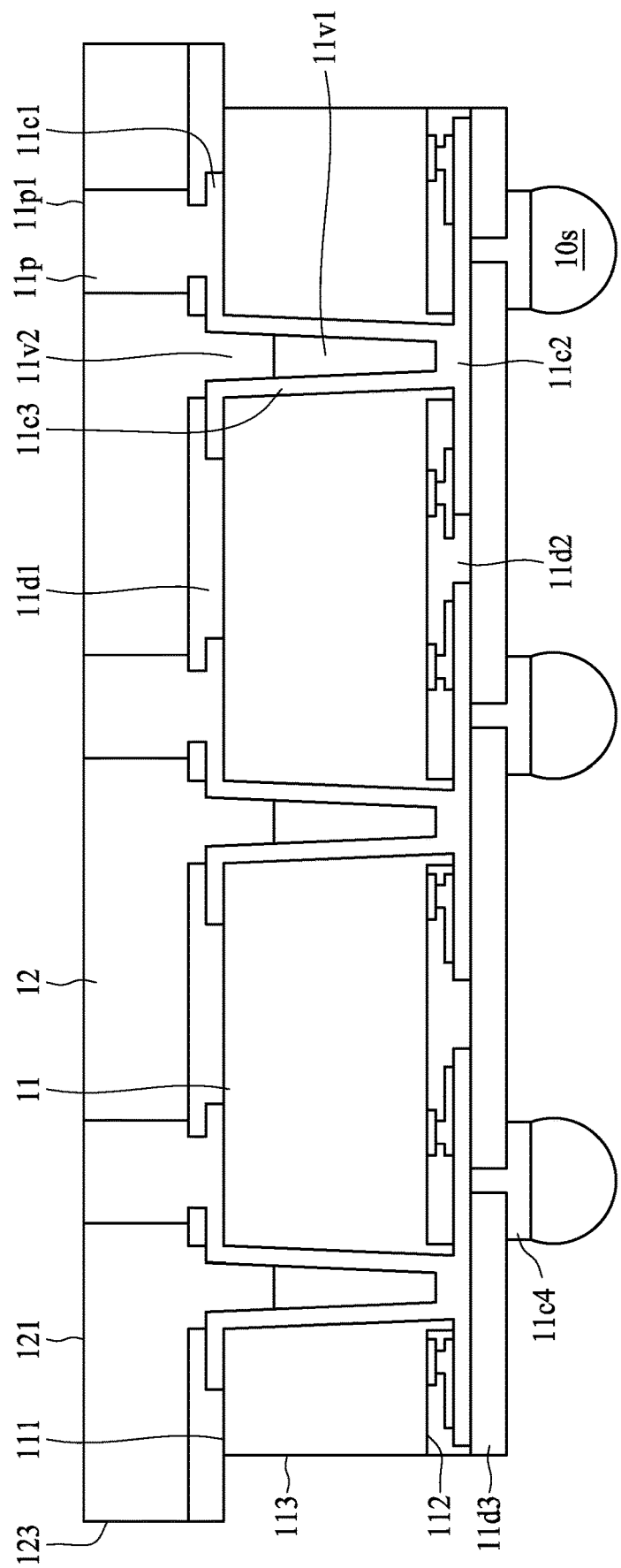

FIG. 1H illustrates a cross-sectional view of a semiconductor structure in accordance with some embodiments of the present disclosure. In some embodiments, the semiconductor structure illustrated in FIG. 1H may be implemented or used for the semiconductor device package 1 as shown in FIG. 1A. For example, a portion of the semiconductor device package 1 encircled by a dotted-line square 1A as shown in FIG. 1A may be replaced by the semiconductor structure as shown in FIG. 1H. The semiconductor structure as shown in FIG. 1H is similar to the semiconductor structure as shown in FIG. 1C, except that as shown in FIG. 1H, a portion of the electronic component 11 at or near the periphery of the electronic component 11 is removed.

Figure 1I:
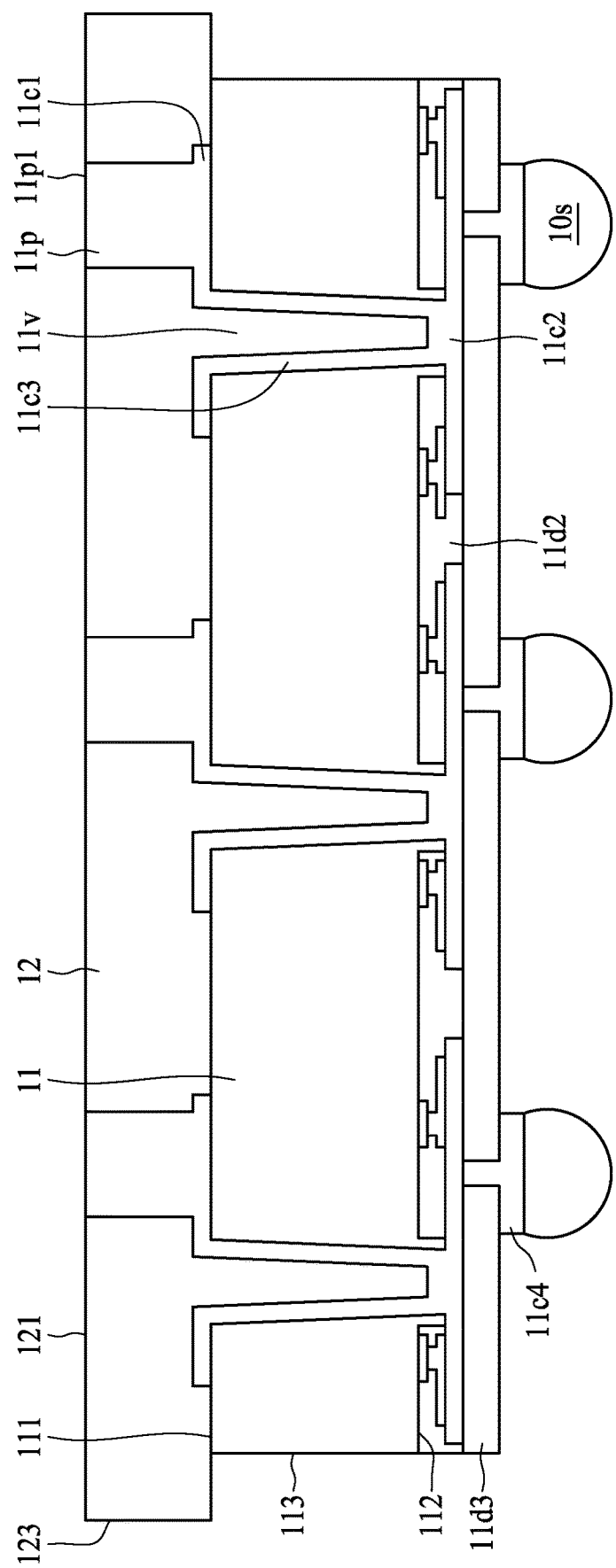

FIG. 1I illustrates a cross-sectional view of a semiconductor structure in accordance with some embodiments of the present disclosure. In some embodiments, the semiconductor structure illustrated in FIG. 1I may be implemented or used for the semiconductor device package 1 as shown in FIG. 1A. For example, a portion of the semiconductor device package 1 encircled by a dotted-line square 1A as shown in FIG. 1A may be replaced by the semiconductor structure as shown in FIG. 1I. The semiconductor structure as shown in FIG. 1J is similar to the semiconductor structure as shown in FIG. 1D, except that as shown in FIG. 1J, a portion of the electronic component 11 at or near the periphery of the electronic component 11 is removed.

Figure 1J:
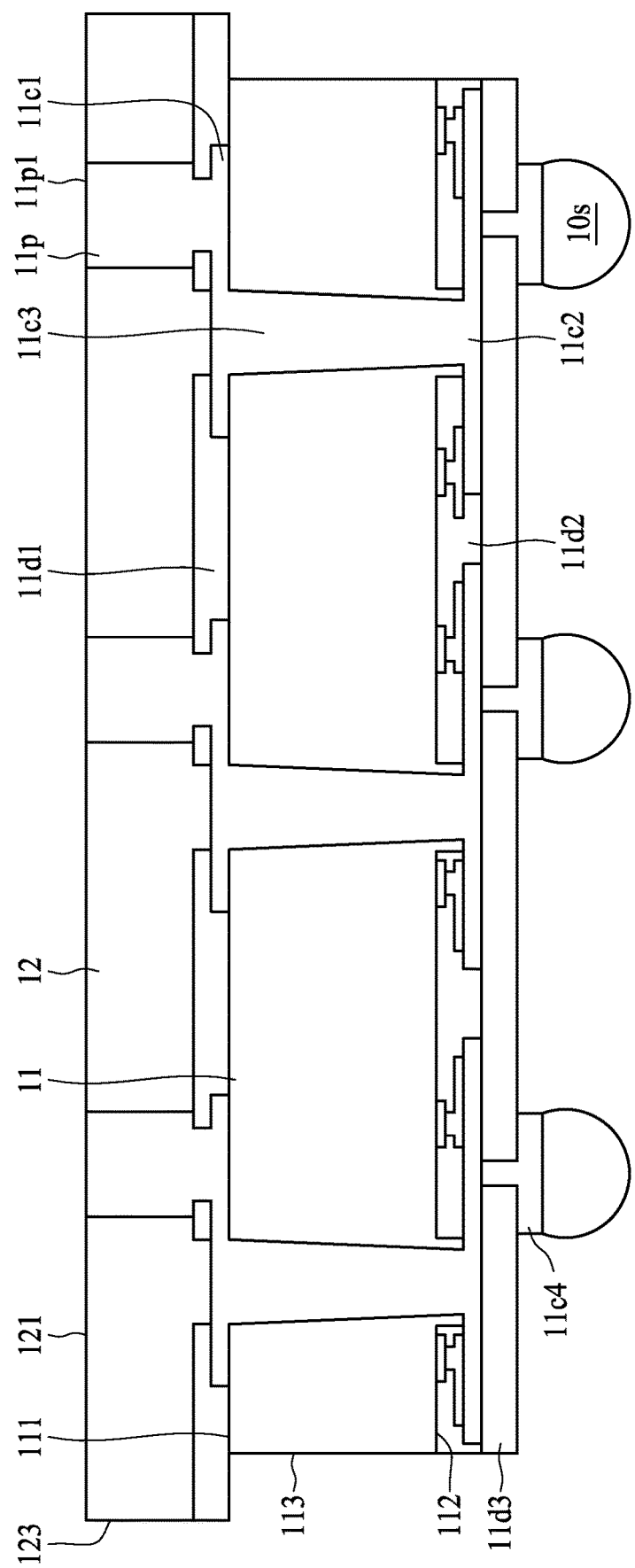

FIG. 1J illustrates a cross-sectional view of a semiconductor structure in accordance with some embodiments of the present disclosure. In some embodiments, the semiconductor structure illustrated in FIG. 1J may be implemented or used for the semiconductor device package 1 as shown in FIG. 1A. For example, a portion of the semiconductor device package 1 encircled by a dotted-line square 1A as shown in FIG. 1A may be replaced by the semiconductor structure as shown in FIG. 1J. The semiconductor structure as shown in FIG. 1J is similar to the semiconductor structure as shown in FIG. 1E, except that as shown in FIG. 1J, a portion of the electronic component 11 at or near the periphery of the electronic component 11 is removed.

Figure 1K:
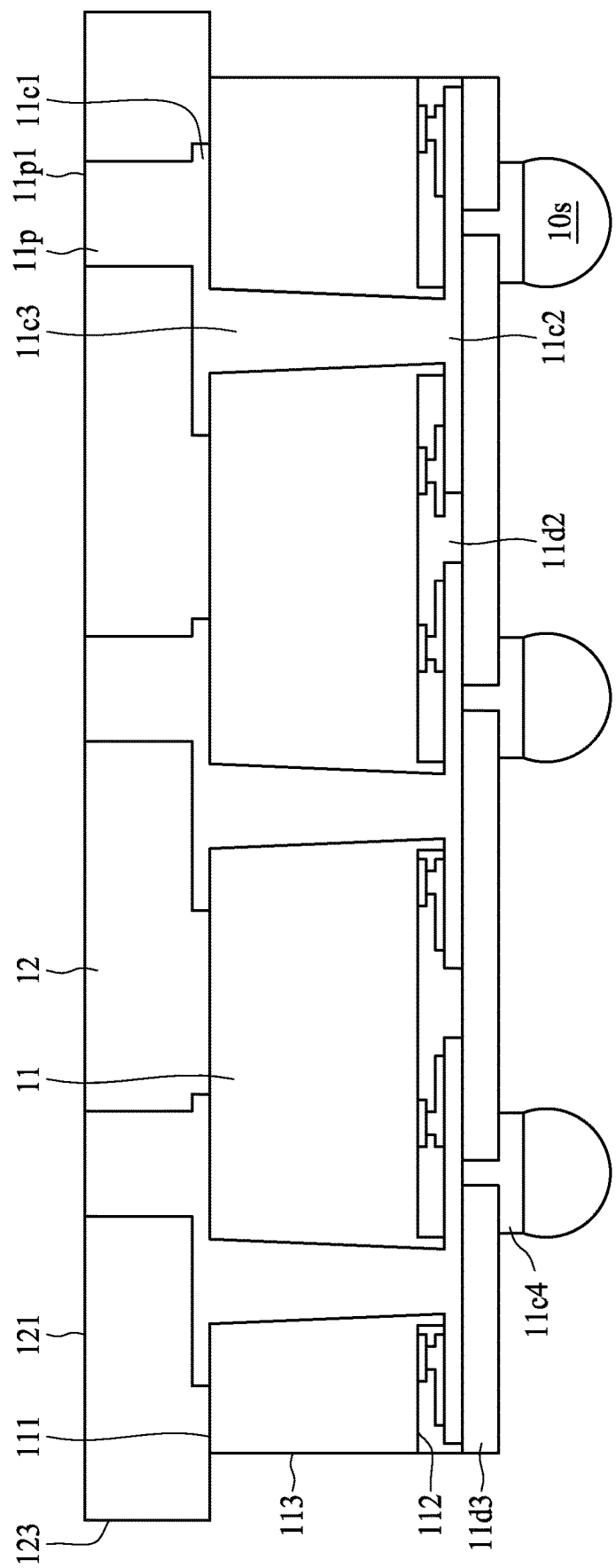

FIG. 1K illustrates a cross-sectional view of a semiconductor structure in accordance with some embodiments of the present disclosure. In some embodiments, the semiconductor structure illustrated in FIG. 1K may be implemented or used for the semiconductor device package 1 as shown in FIG. 1A. For example, a portion of the semiconductor device package 1 encircled by a dotted-line square 1A as shown in FIG. 1A may be replaced by the semiconductor structure as shown in FIG. 1K. The semiconductor structure as shown in FIG. 1K is similar to the semiconductor structure as shown in FIG. 1F, except that as shown in FIG. 1K, a portion of the electronic component 11 at or near the periphery of the electronic component 11 is removed.

Figure 1L:
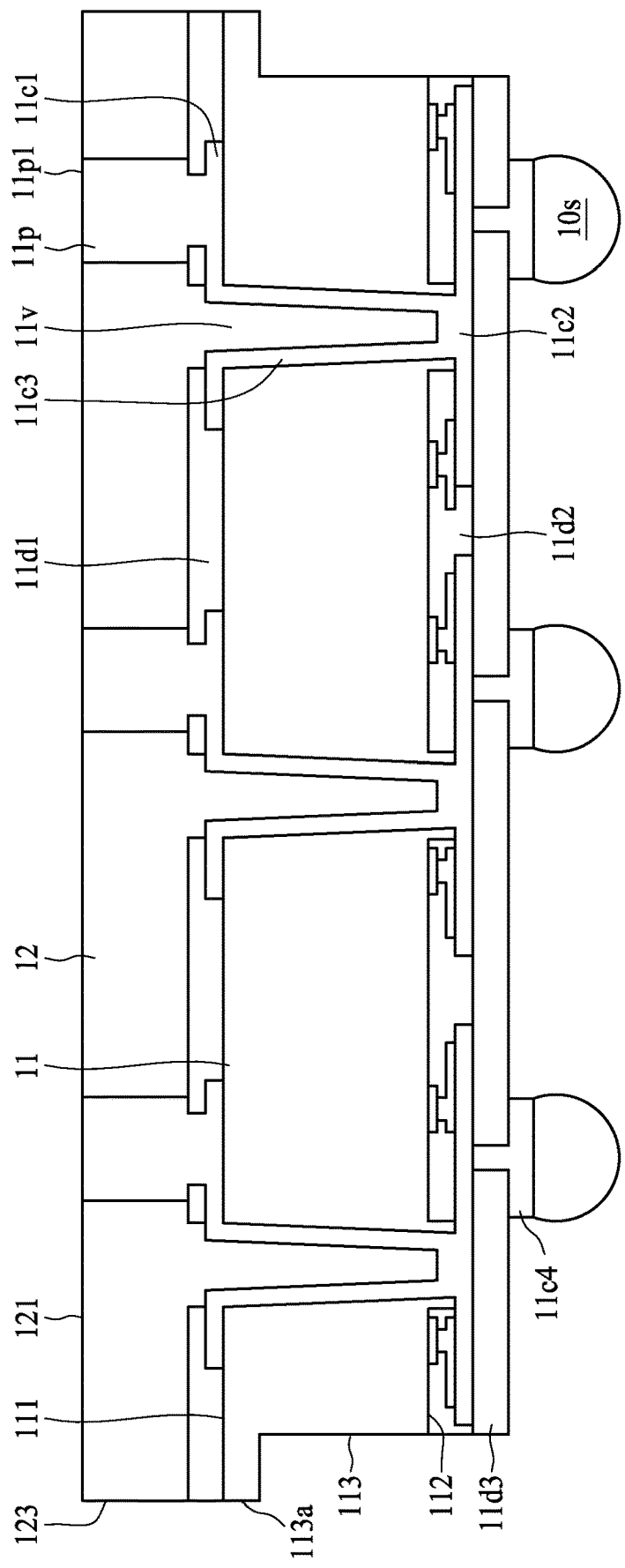

FIG. 1L illustrates a cross-sectional view of a semiconductor structure in accordance with some embodiments of the present disclosure. In some embodiments, the semiconductor structure illustrated in FIG. 1L may be implemented or used for the semiconductor device package 1 as shown in FIG. 1A. For example, a portion of the semiconductor device package 1 encircled by a dotted-line square 1A as shown in FIG. 1A may be replaced by the semiconductor structure as shown in FIG. 1L. The semiconductor structure as shown in FIG. 1L is similar to the semiconductor structure as shown in FIG. 1G, except that as shown in FIG. 1L, a portion of the electronic component 11 at or near the top surface 111 of the electronic component 11 remains. For example, the electronic component 11 has a lateral surface 113a substantially coplanar with the lateral surface 123 of the reinforcement layer 12 and a lateral surface 113 recessed from the lateral surface 113a.

Figure 1M:
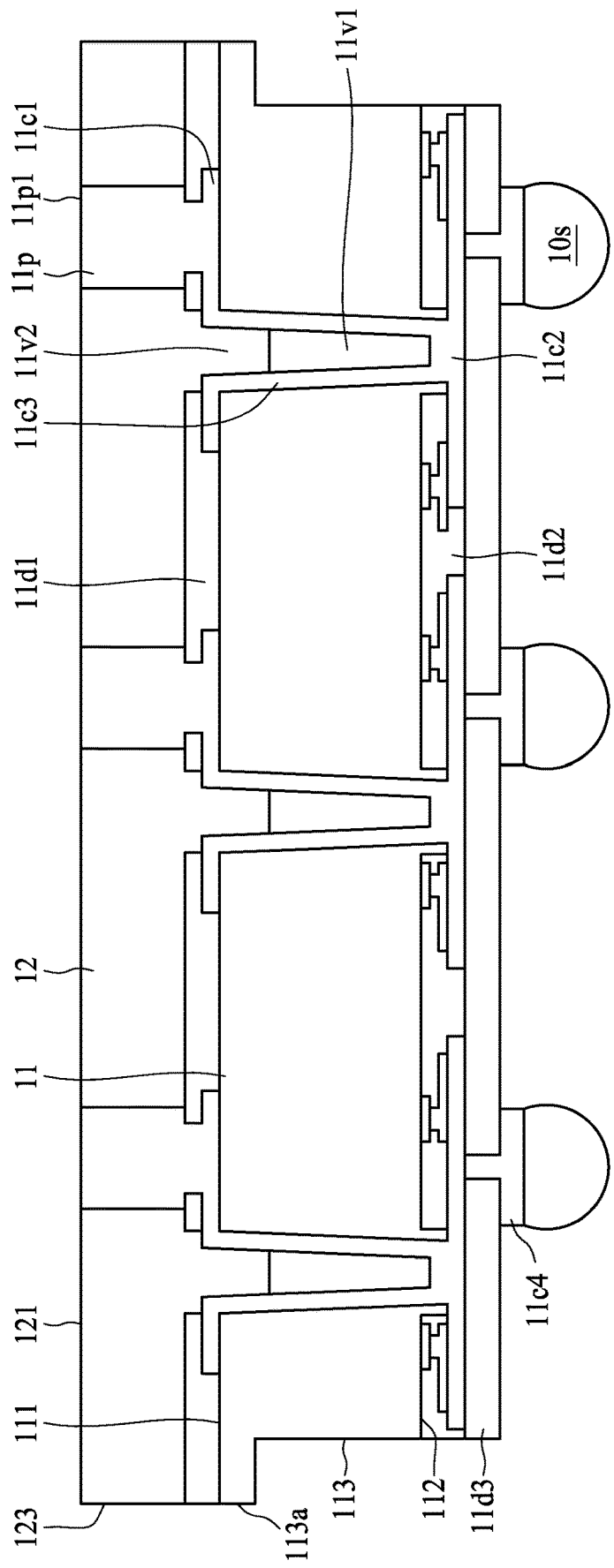

FIG. 1M illustrates a cross-sectional view of a semiconductor structure in accordance with some embodiments of the present disclosure. In some embodiments, the semiconductor structure illustrated in FIG. 1M may be implemented or used for the semiconductor device package 1 as shown in FIG. 1A. For example, a portion of the semiconductor device package 1 encircled by a dotted-line square 1A as shown in FIG. 1A may be replaced by the semiconductor structure as shown in FIG. 1M. The semiconductor structure as shown in FIG. 1M is similar to the semiconductor structure as shown in FIG. 1H, except that as shown in FIG. 1M, a portion of the electronic component 11 at or near the top surface 111 of the electronic component 11 remains.

Figure 1N:
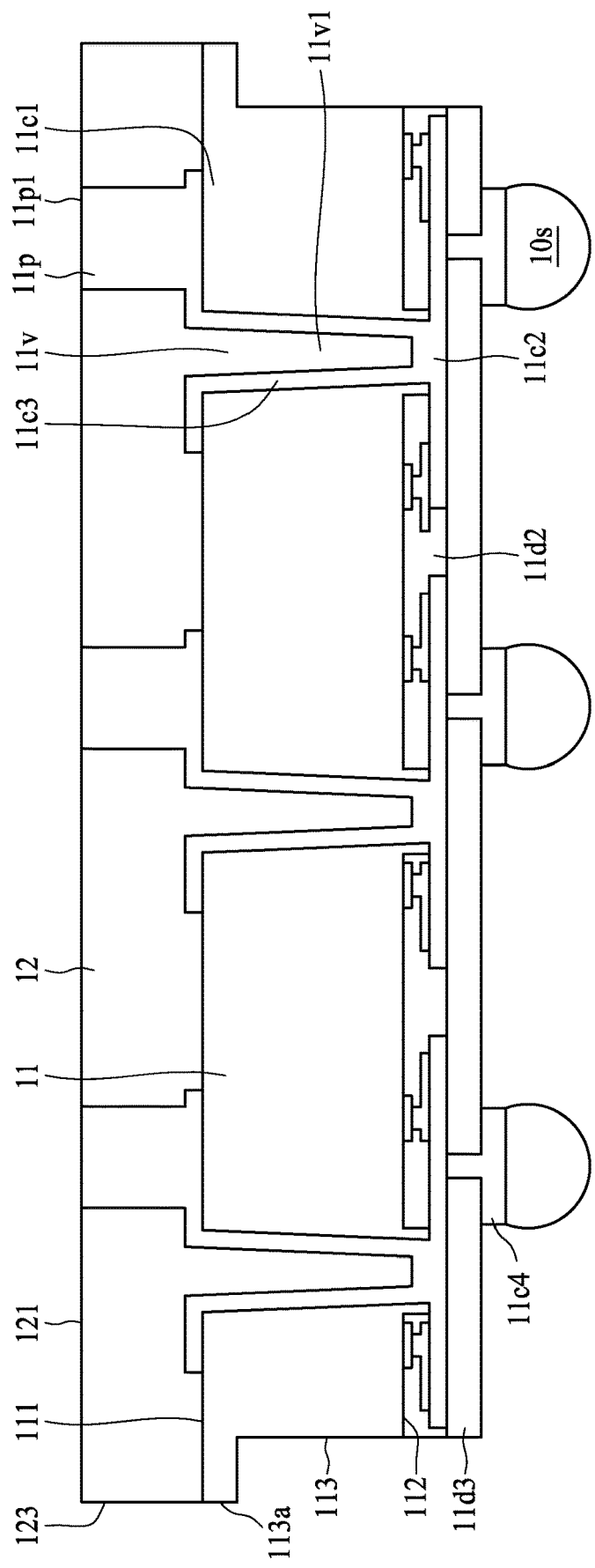
Figure 10:
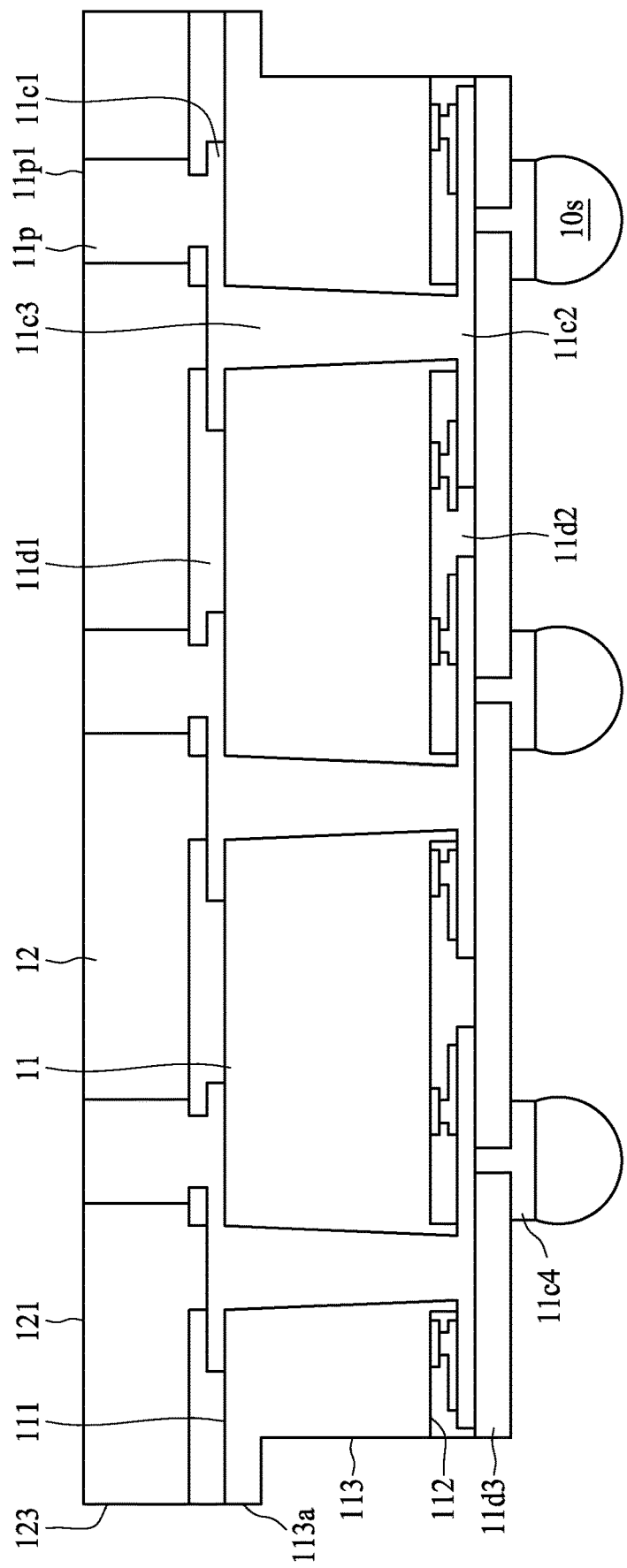

FIG. 1N illustrates a cross-sectional view of a semiconductor structure in accordance with some embodiments of the present disclosure. In some embodiments, the semiconductor structure illustrated in FIG. 1N may be implemented or used for the semiconductor device package 1 as shown in FIG. 1A. For example, a portion of the semiconductor device package 1 encircled by a dotted-line square 1A as shown in FIG. 1A may be replaced by the semiconductor structure as shown in FIG. 1N. The semiconductor structure as shown in FIG. 1N is similar to the semiconductor structure as shown in FIG. 1I, except that as shown in FIG. 1N, a portion of the electronic component 11 at or near the top surface 111 of the electronic component 11 remains.

FIG. 1O illustrates a cross-sectional view of a semiconductor structure in accordance with some embodiments of the present disclosure. In some embodiments, the semiconductor structure illustrated in FIG. 1O may be implemented or used for the semiconductor device package 1 as shown in FIG. 1A. For example, a portion of the semiconductor device package 1 encircled by a dotted-line square 1A as shown in FIG. 1A may be replaced by the semiconductor structure as shown in FIG. 1O. The semiconductor structure as shown in FIG. 1O is similar to the semiconductor structure as shown in FIG. 1J, except that as shown in FIG. 1O, a portion of the electronic component 11 at or near the top surface 111 of the electronic component 11 remains.

Figure 1P:
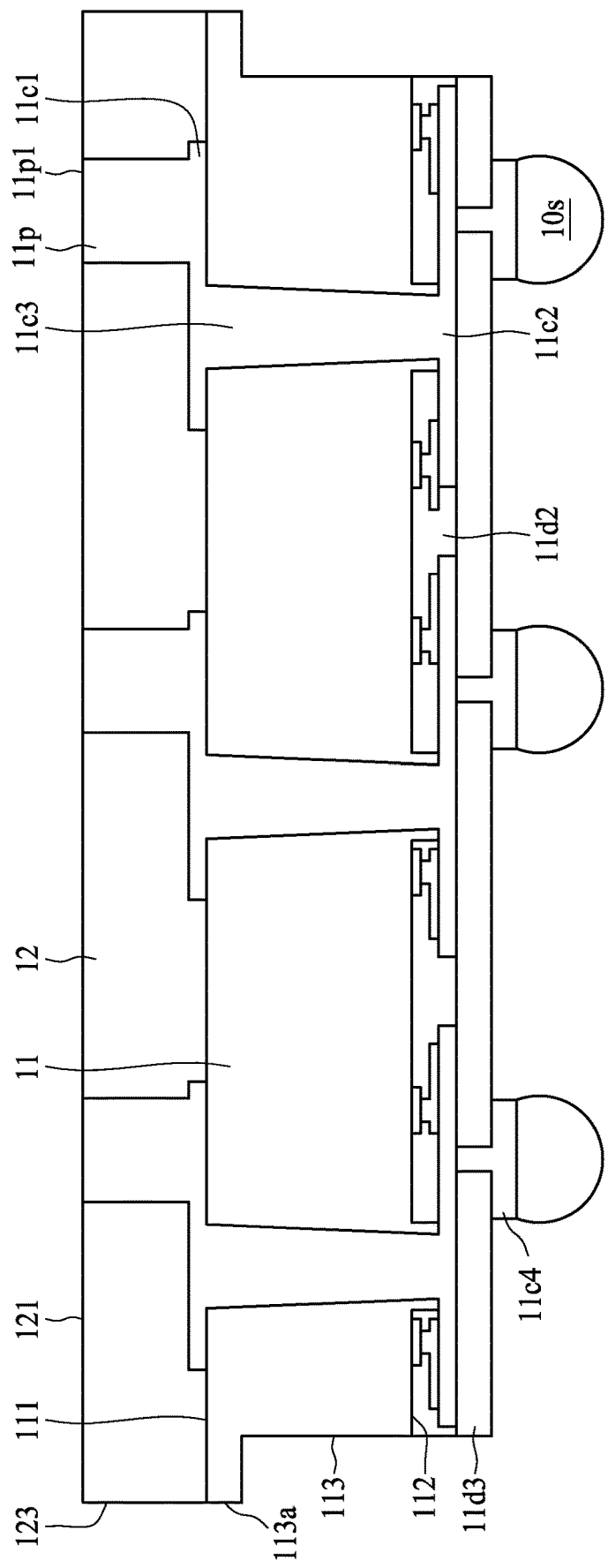

FIG. 1P illustrates a cross-sectional view of a semiconductor structure in accordance with some embodiments of the present disclosure. In some embodiments, the semiconductor structure illustrated in FIG. 1P may be implemented or used for the semiconductor device package 1 as shown in FIG. 1A. For example, a portion of the semiconductor device package 1 encircled by a dotted-line square 1A as shown in FIG. 1A may be replaced by the semiconductor structure as shown in FIG. 1P. The semiconductor structure as shown in FIG. 1P is similar to the semiconductor structure as shown in FIG. 1K, except that as shown in FIG. 1P, a portion of the electronic component 11 at or near the top surface 111 of the electronic component 11 remains.

Figure 1Q:
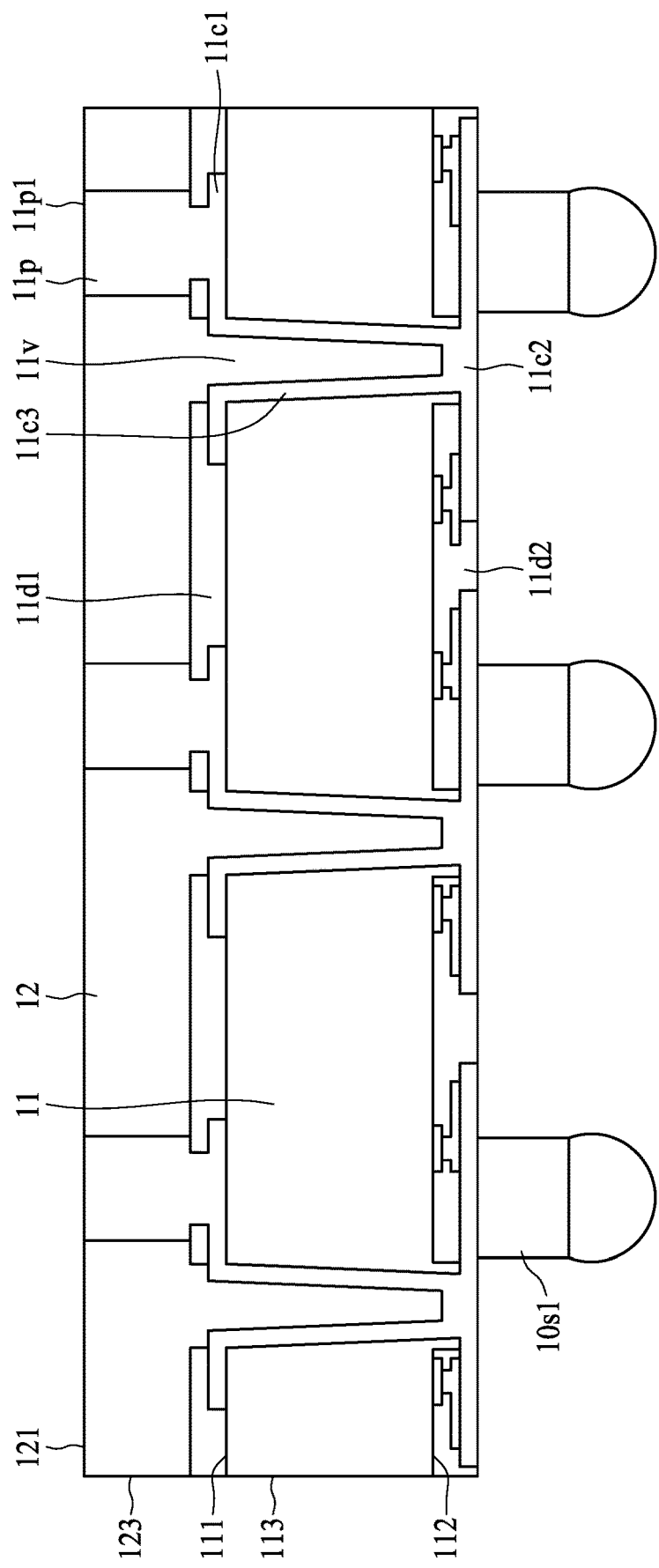

FIG. 1Q illustrates a cross-sectional view of a semiconductor structure in accordance with some embodiments of the present disclosure. In some embodiments, the semiconductor structure illustrated in FIG. 1Q may be implemented or used for the semiconductor device package 1 as shown in FIG. 1A. For example, a portion of the semiconductor device package 1 encircled by a dotted-line square 1A as shown in FIG. 1A may be replaced by the semiconductor structure as shown in FIG. 1Q. The semiconductor structure as shown in FIG. 1Q is similar to the semiconductor structure as shown in FIG. 1B, and some of the differences therebetween are described below.

The dielectric layer 11d3 and the conductive layer 11c4 are omitted. One or more conductive pillars 10s1 are disposed on the conductive layer 11c2 and electrically connected to the conductive layer 11c2.

Figure 1R:
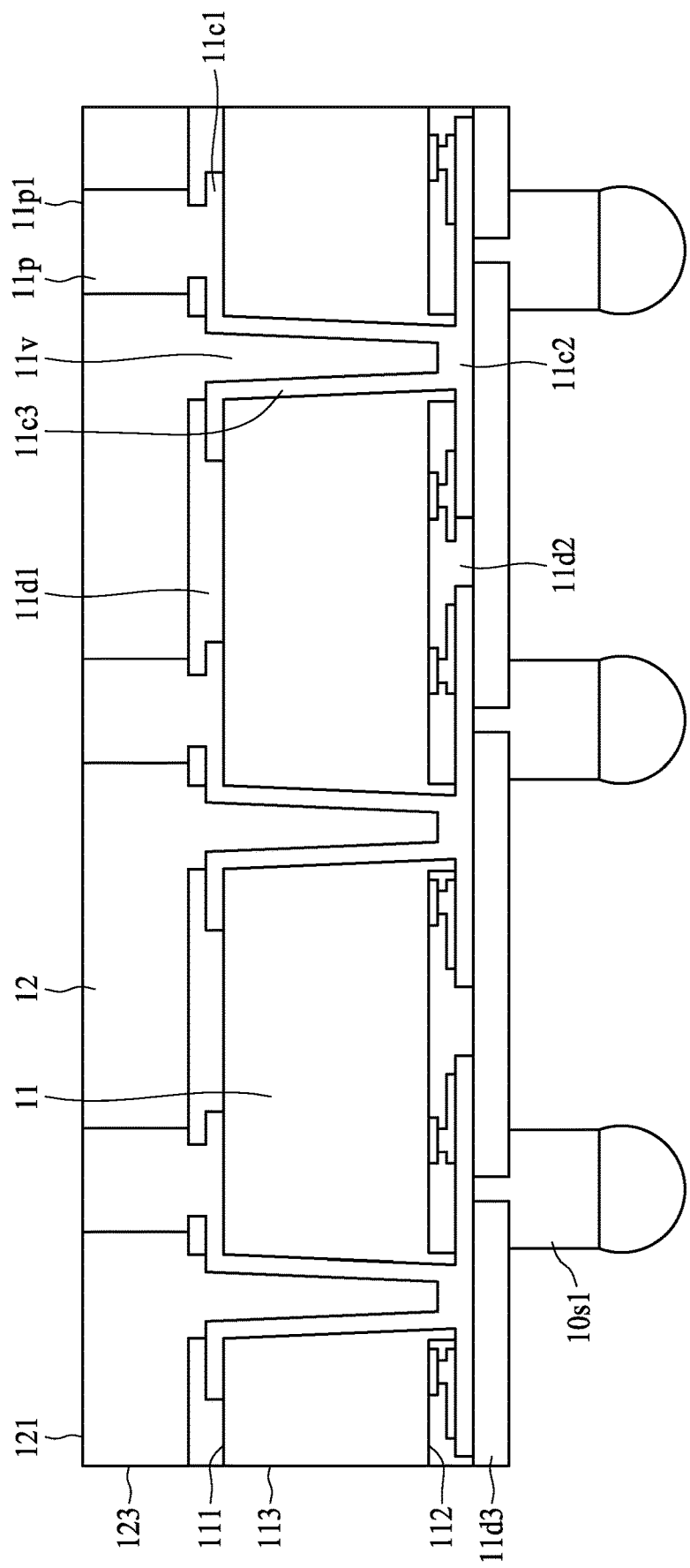

FIG. 1R illustrates a cross-sectional view of a semiconductor structure in accordance with some embodiments of the present disclosure. In some embodiments, the semiconductor structure illustrated in FIG. 1R may be implemented or used for the semiconductor device package 1 as shown in FIG. 1A. For example, a portion of the semiconductor device package 1 encircled by a dotted-line square 1A as shown in FIG. 1A may be replaced by the semiconductor structure as shown in FIG. 1R. The semiconductor structure as shown in FIG. 1R is similar to the semiconductor structure as shown in FIG. 1B, and except that the electrical contacts 10s as shown in FIG. 1B are replaced by the conductive pillars 10s1.

Figure 2:
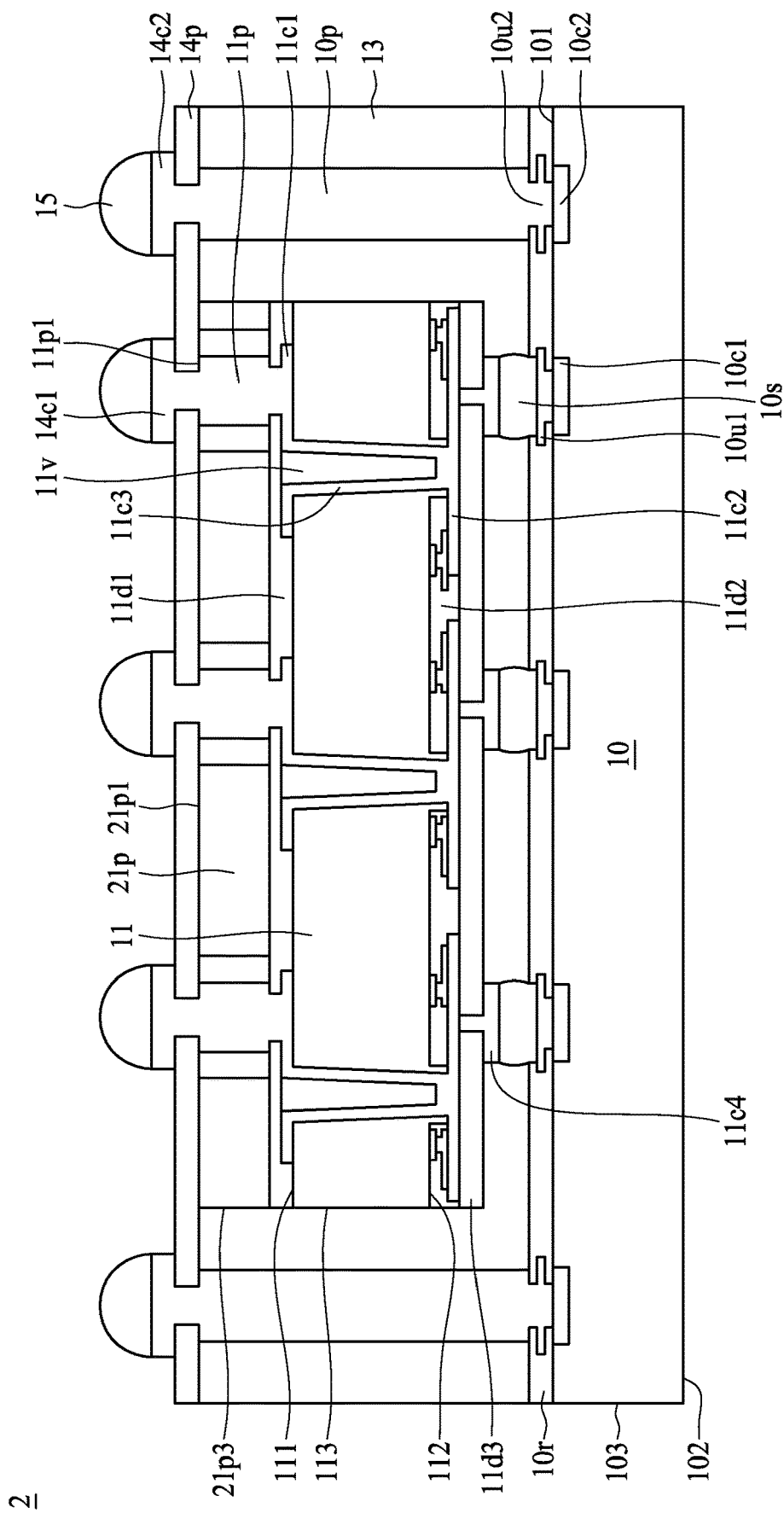
FIG. 2 illustrates a cross-sectional view of a semiconductor device package in accordance with some embodiments of the present disclosure.

FIG. 2 illustrates a cross-sectional view of a semiconductor device package 2 according to some embodiments of the present disclosure. The semiconductor device package 2 is similar to the semiconductor device package 1 as shown in FIG. 1A, and some of the differences therebetween are described below.

A reinforcement layer 21p is disposed on the surface 111 of the electronic component 11. The reinforcement layer 21p may be disposed on the dielectric layer 11d1 of the electronic component 11. The reinforcement layer 21p is adjacent to the electrical contacts 11p and spaced apart from the electrical contacts 11p. For example, there is a gap between the electrical contacts 11p and the reinforcement layer 21p. In some embodiments, a distance between the electrical contacts 11p and the reinforcement layer 21p is about 30 micrometers or less. The reinforcement layer 21p may be or include a conductive layer (or metal layer). For example, the reinforcement layer 21p may include one or more dummy pillars that are disconnected to the electronic component 11 and the conductive layer 14c1.

In some embodiments, a top surface 21p1 of the reinforcement layer 21p is substantially coplanar with the top surface 11p1 of the electrical contacts 11p. For example, an altitude of the top surface 21p1 of the reinforcement layer 21p is substantially the same as an altitude of the top surface 11p1 of the electrical contacts 11p. In some embodiments, a lateral surface 21p3 of the reinforcement layer 21p is substantially coplanar with the lateral surface 113 of the electronic component 11.

The package body 13 covers the lateral surface 21p3 of the reinforcement layer 21p. In some embodiments, the package body 13 may be disposed within the gap between the electrical contacts 11p and the reinforcement layer 21p. For example, the lateral surface of the electrical contacts 11p is covered and in contact with the package body 13.

Figure 2A:
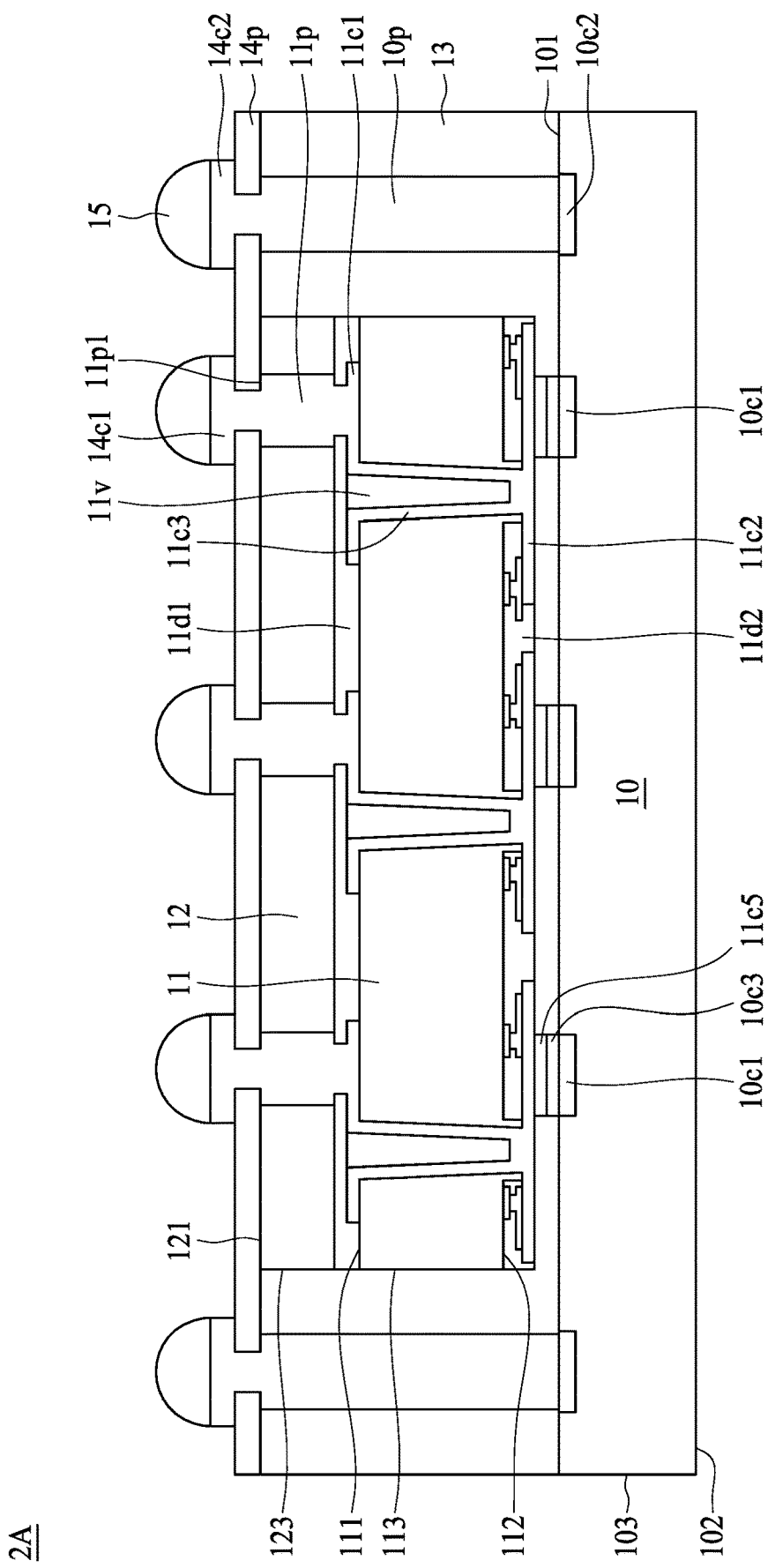
FIG. 2A illustrates a cross-sectional view of a semiconductor device package in accordance with some embodiments of the present disclosure.
Figure 2A:
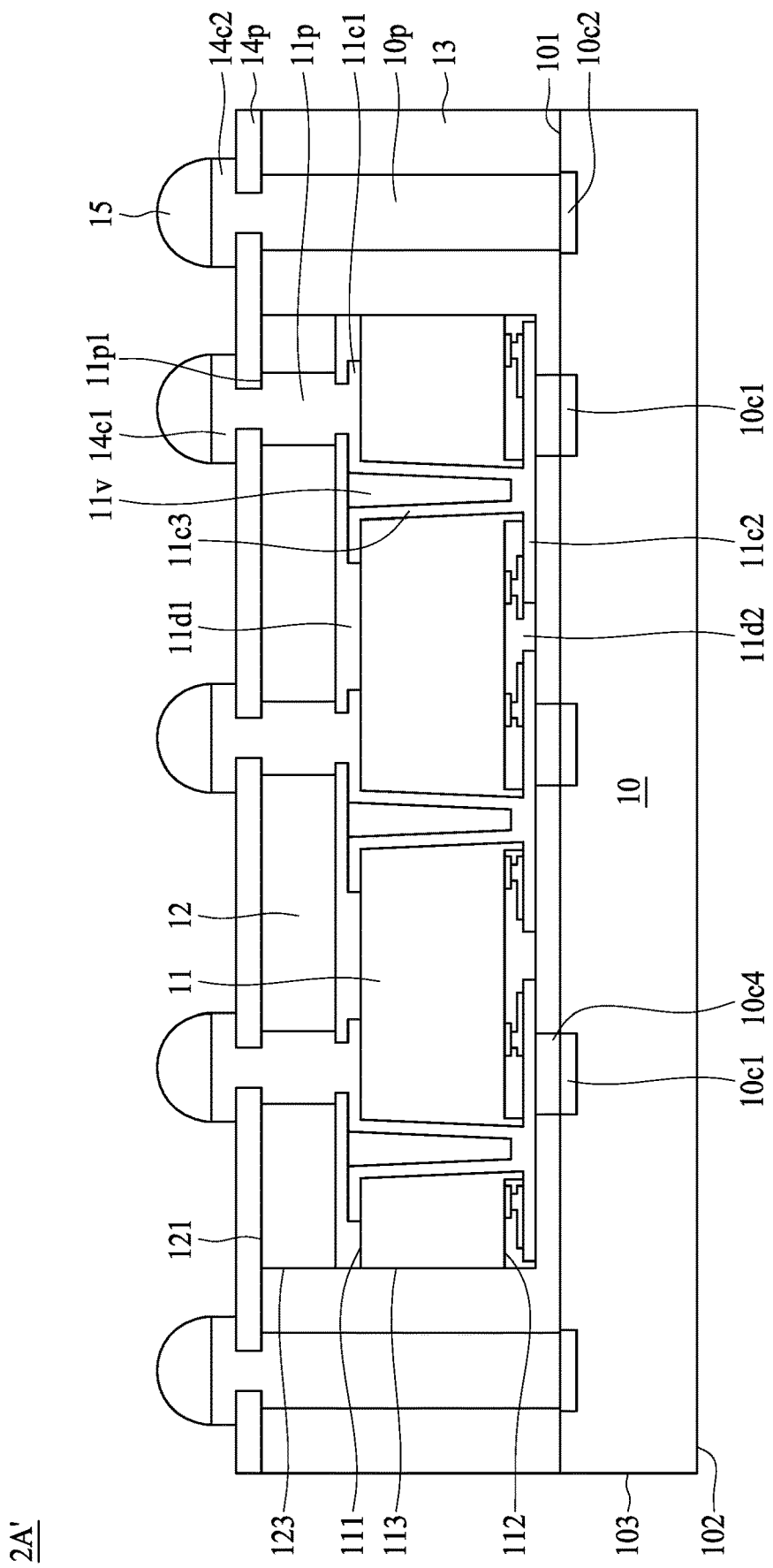

FIG. 2A illustrates a cross-sectional view of a semiconductor device package 2A in accordance with some embodiments of the present disclosure. The semiconductor device package 2A is similar to the semiconductor device package 1 as shown in FIG. 1A, and some of the differences therebetween are described below.

A conductive layer 11c5 (e.g., a conductive stud such as a metal stud) is disposed on a portion of the conductive layer 11c2. A conductive layer 10c3 (e.g., a conductive pad or a conductive stud) is disposed on the conductive pad 10c1. The conductive layer 11c5 is bonded onto the conductive layer 10c3 to form a bonded joint between the electronic component 10 and the electronic component 11. The package body 13 covers the conductive layer 10c3 and the conductive layer 11c5. In some embodiments, the conductive layer 11c5 and the conductive layer 10c3 may include the same material. Alternatively, the conductive layer 11c5 and the conductive layer 10c3 may include different materials.

The electronic component 11 is disposed on the active surface 101 of the electronic component 10 and electrically connected to the active surface 101 (e.g., to the conductive pad 10c1) of the electronic component 10 through, for example, the bonded joint including the conductive layers 10c3 and 11c5. In some embodiments, the bonded joint between the electronic component 10 and the electronic component 11 may be free from a soldering material. In some embodiments, the bonded joint between the electronic component 10 and the electronic component 11 may be free from a controlled collapse chip connection (C4) bump, a ball grid array (BGA) or a land grid array (LGA).

Referring to FIG. 2A, when the semiconductor device package 2A is attached to an external structure such as a PCB, a voltage from the PCB that serves as an operation voltage is provided to the electronic component 11 via one of the electrical contacts 15, a wiring route (not shown) in the conductive layer 11c1 (may include a redistribution layer (RDL), conductive pads or the like), a conductive via 11c3 (e.g., through-silicon-via (TSV)), a bonded joint (including the conductive layers 10c3 and 11c5) between the electronic component 10 and the electronic component 11, and then another bonded joint (including another set of the conductive layers 10c3 and 11c5), forming a powering path. The bonded joint is formed by the conductive layers 10c3 and 11c5, and thus is common to the electronic component 10 and the electronic component 11. The powering path is relatively short for powering the electronic component 10 and the electronic component 11 in the semiconductor device package 2A on the PCB.

According to some embodiments of the present disclosure, in the semiconductor device package 2A, the electronic component 11 (e.g., playing the role of a decoupling capacitor) is directly bonded to the electronic component 10 (e.g., playing the role of a processor) without routing for electrical connection to each other through additional intermediate semiconductor structures or components (e.g., additional conductive layers and/or solder balls). Since a relatively long path in the semiconductor device package may incur more parasitic effects than the relatively short path in the semiconductor device package 2A illustrated in FIG. 2A, as a result, the electrical losses can be significantly reduced in the semiconductor package structure 2A. For example, direct connection between the electronic component 10 and the electronic component 11 through the bonded joints (including the conductive layers 10c3 and 11c5) helps alleviate parasitic effects and thus reduces electrical losses.

Figure 3A:
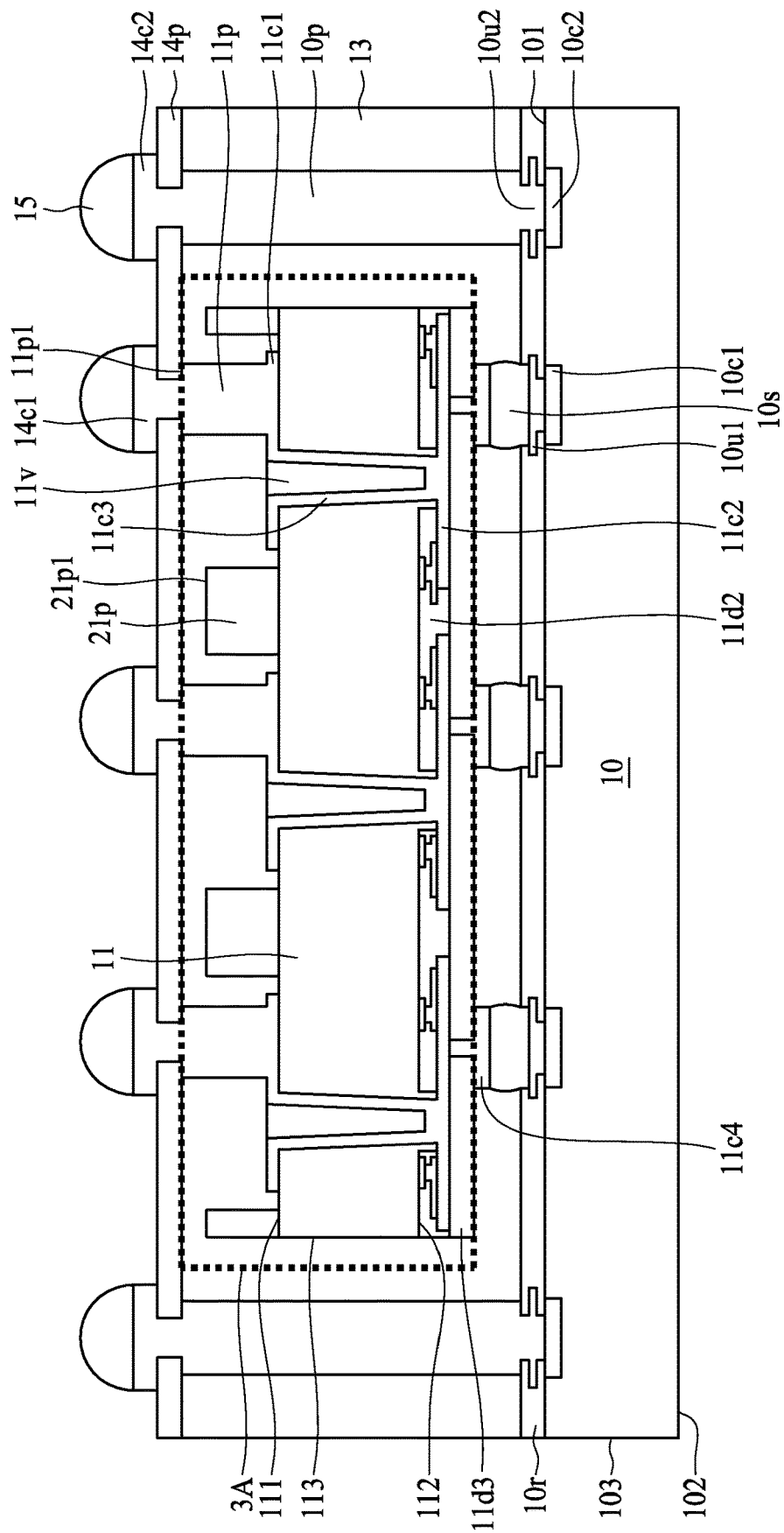
FIG. 3A illustrates a cross-sectional view of a semiconductor device package in accordance with some embodiments of the present disclosure.

In some embodiments, the bonded joint illustrated in FIG. 2A may be implemented or used for the semiconductor device package 1 as shown in FIG. 1A. For example, the conductive layers 10u1, 10u2 and 11c4, the dielectric layer 11d3, the electrical contact 10s, and the protection layer 10r may be replaced by the conductive layers 10c3 and 11c5 as shown in FIG. 2A. Similarly, the bonded joint illustrated in FIG. 2A may be implemented or used for the semiconductor device package 3 as shown in FIG. 3A and other semiconductor device packages implementing or using the structures illustrated in FIGS. 3B-3I, which will be described hereinafter.

FIG. 2A' illustrates a cross-sectional view of a semiconductor device package 2A' in accordance with some embodiments of the present disclosure. The semiconductor device package 2A' is similar to the semiconductor device package 2A as shown in FIG. 2A, and some of the differences therebetween are described below.

In some embodiments, the electronic component 10 includes a conductive layer 10c4. In some embodiments, the conductive layer 10c4 of the electronic component 10 is bonded onto a conductive layer (e.g., the conductive layer 11c2) of the electronic component 11. In some embodiments, the electronic component 11 is electrically connected to the active surface 101 of the electronic component 10 through electrical contacts, and the electrical contacts may include a direct connection or a bonded joint formed by the conductive layer 10c4 of the electronic component 10c4 bonded onto a conductive layer of the electronic component 11. According to some embodiments of the present disclosure, in the semiconductor device package 2A', the direction connection between the electronic component 10 and the electronic component 11 through the electrical contact (i.e., the conductive layer 10c4) helps alleviate parasitic effects and thus reduces electrical losses.

Figure 2B:
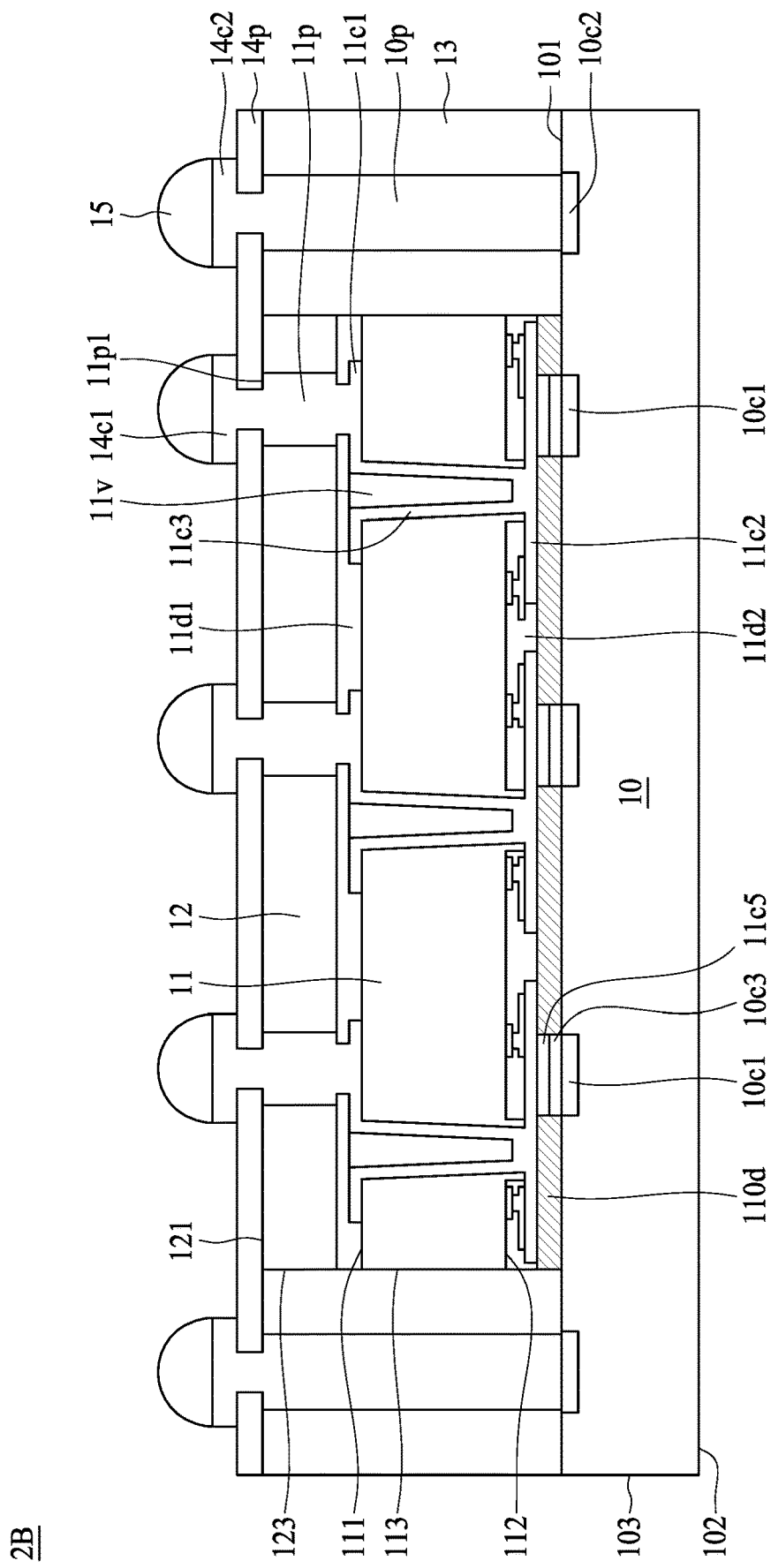
FIG. 2B illustrates a cross-sectional view of a semiconductor device package in accordance with some embodiments of the present disclosure.
Figure 2B:
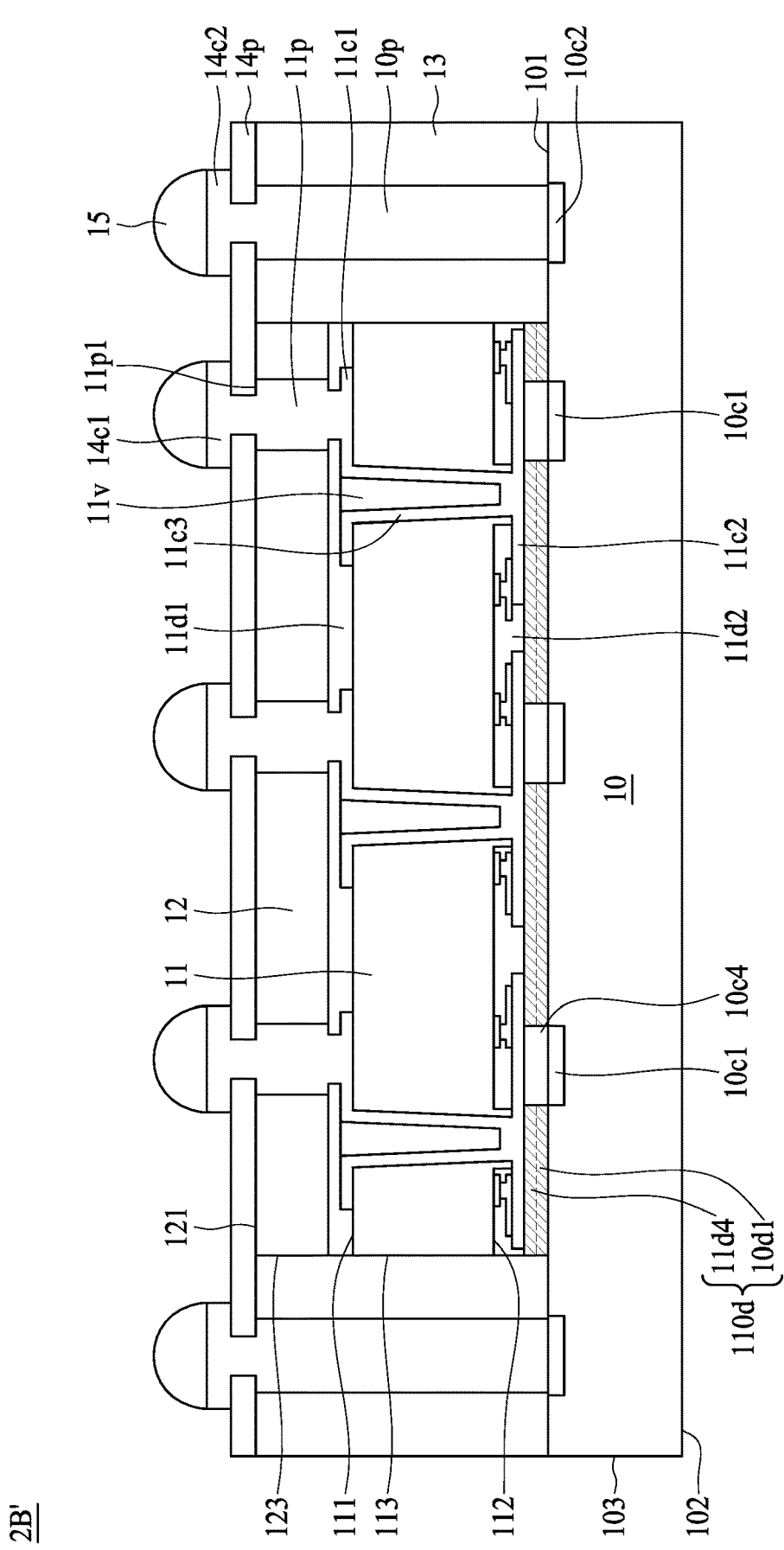

FIG. 2B illustrates a cross-sectional view of a semiconductor device package 2B in accordance with some embodiments of the present disclosure. The semiconductor device package 2B is similar to the semiconductor device package 2A as shown in FIG. 2A, and some of the differences therebetween are described below.

A dielectric layer 110d surrounds the conductive layers 10c3 and 11c5. The dielectric layer 110d may include two dielectric sub-layers respectively disposed on the electronic component 11 (e.g., the conductive layer 11c2 and the dielectric layer 11d2) and the electronic component 10 (e.g., the conductive pad 10c1). The two dielectric sub-layers that are bonded to each other together with the conductive layers 10c3 and 11c5 that are bonded to each other form a hybrid bonding structure. The package body 13 covers the hybrid bonding structure.

The electronic component 11 is disposed on the active surface 101 of the electronic component 10 and electrically connected to the active surface 101 (e.g., to the conductive pad 10c1) of the electronic component 10 through the hybrid bonding structure including the conductive layers 10c3 and 11c5 and the dielectric layer 110d. According to some embodiments of the present disclosure, direct connection between the electronic component 10 and the electronic component 11 through the hybrid bonding structure (including the conductive layers 10c3 and 11c5 and the dielectric layer 110d) helps alleviate parasitic effects and thus reduces electrical losses. Similarly to the bonded joint illustrated in FIG. 2A, the hybrid bonding structure illustrated in FIG. 2B may be implemented or used for the semiconductor device packages illustrated in various embodiments of the present disclosure.

FIG. 2B illustrates a cross-sectional view of a semiconductor device package 2B' in accordance with some embodiments of the present disclosure. The semiconductor device package 2B' is similar to the semiconductor device package 2A' as shown in FIG. 2A', and some of the differences therebetween are described below.

In some embodiments, the semiconductor device package 2B' further includes a dielectric layer 110d around the direct connection or bonded joint through the electrical contact (e.g., the conductive layer 10c4). In some embodiments, the dielectric layer 110d includes an additional direct connection formed by a dielectric sub-layer 11d4 of the electronic component 11 bonded onto a dielectric sub-layer 10d1 of the electronic component 10. In some embodiments, an interface may be between the dielectric sub-layers 11d4 and 10d1 as illustrated in FIG. 23. In some other embodiments, the dielectric sub-layers 11d4 and 10d1 may be free of an interface. In some embodiments, the direct connection formed of the conductive layer 10c4 together with the direct connection formed of the dielectric sub-layers 11d4 and 10d1 form a hybrid bonding structure. According to some embodiments of the present disclosure, in the semiconductor device package 23, the direction connections between the electronic component 10 and the electronic component 11 through the electrical contact (i.e., the conductive layer 10c4) and through the dielectric layer 110d help alleviate parasitic effects and thus reduce electrical losses.

FIG. 3A illustrates a cross-sectional view of a semiconductor device package 3 according to some embodiments of the present disclosure. The semiconductor device package 3 is similar to the semiconductor device package 2 as shown in FIG. 2, and some of the differences therebetween are described below.

As shown in FIG. 3A, the dielectric layer 11d1 is omitted. The reinforcement layer 21p is directly disposed on the surface 111 of the electronic component 11. The reinforcement layer 21p is isolated from the conductive layer 11c1 of the electronic component 11. In some embodiments, the top surface 21p1 of the reinforcement layer 21p is non-coplanar with the top surface 11p1 of the electrical contacts 11p. For example, the altitude of the top surface 21p1 of the reinforcement layer 21p is less than the top surface 11p1 of the electrical contacts 11p. In some embodiments, the top surface 21p1 of the reinforcement layer 21p is covered by the package body 13.

Figure 3B:
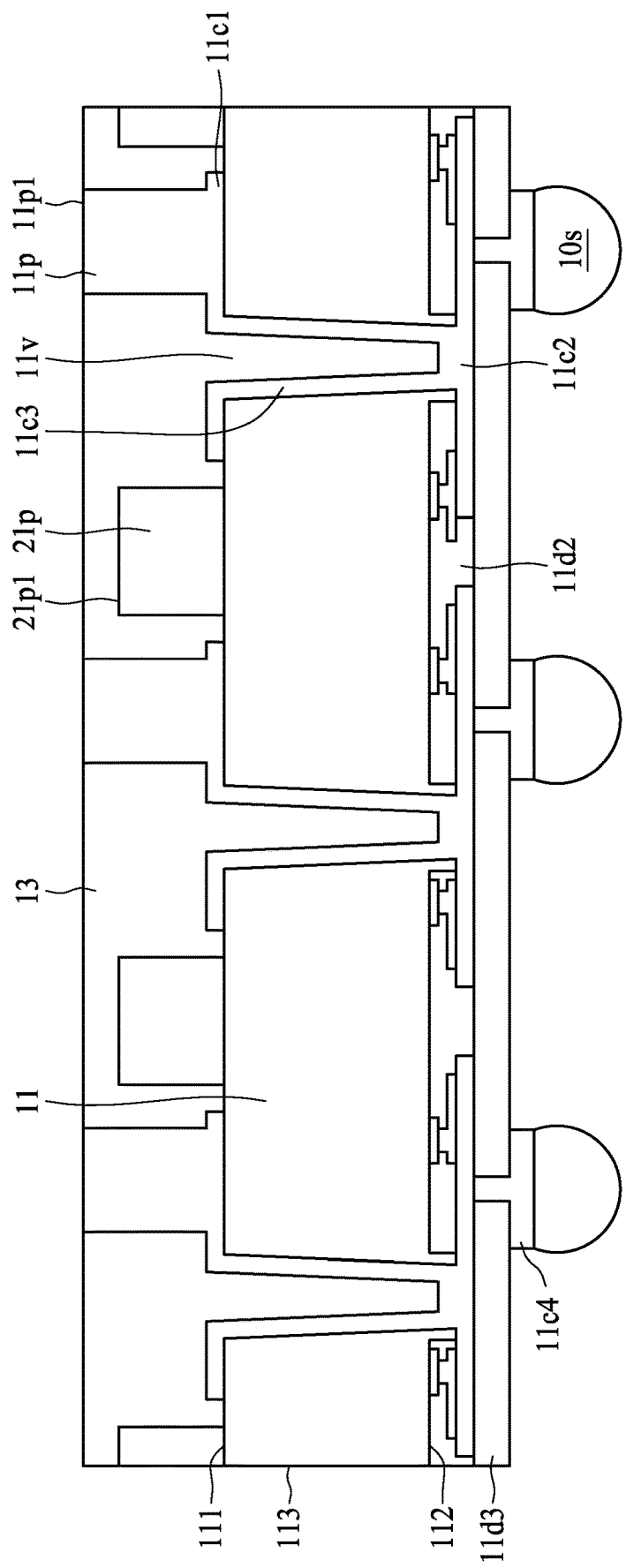
FIG. 3B, FIG. 3C, FIG. 3D, FIG. 3E, FIG. 3F, FIG. 3G, FIG. 3H and FIG. 3I illustrates cross-sectional views of semiconductor structures in accordance with some embodiments of the present disclosure.

FIG. 3B illustrates a cross-sectional view of a semiconductor structure in accordance with some embodiments of the present disclosure. In some embodiments, the semiconductor structure illustrated in FIG. 3B may be implemented or used for the semiconductor device package 3 as shown in FIG. 3A. For example, a portion of the semiconductor device package 3 encircled by a dotted-line square 3A as shown in FIG. 3A may be replaced by the semiconductor structure as shown in FIG. 3B. The semiconductor structure as shown in FIG. 3B is similar to the portion of the semiconductor device package 3 encircled by a dotted-line square 3A as shown in FIG. 3A, and some of the differences therebetween are described below.

As shown in FIG. 3B, the package body 13 further extends within the through holes 11v. For example, the package body 13 is disposed within the through holes 11v and surrounded by the conductive via 11c3. The package body 13 within the through holes 11v is in contact with the conducive via 11c3.

Figure 3C:
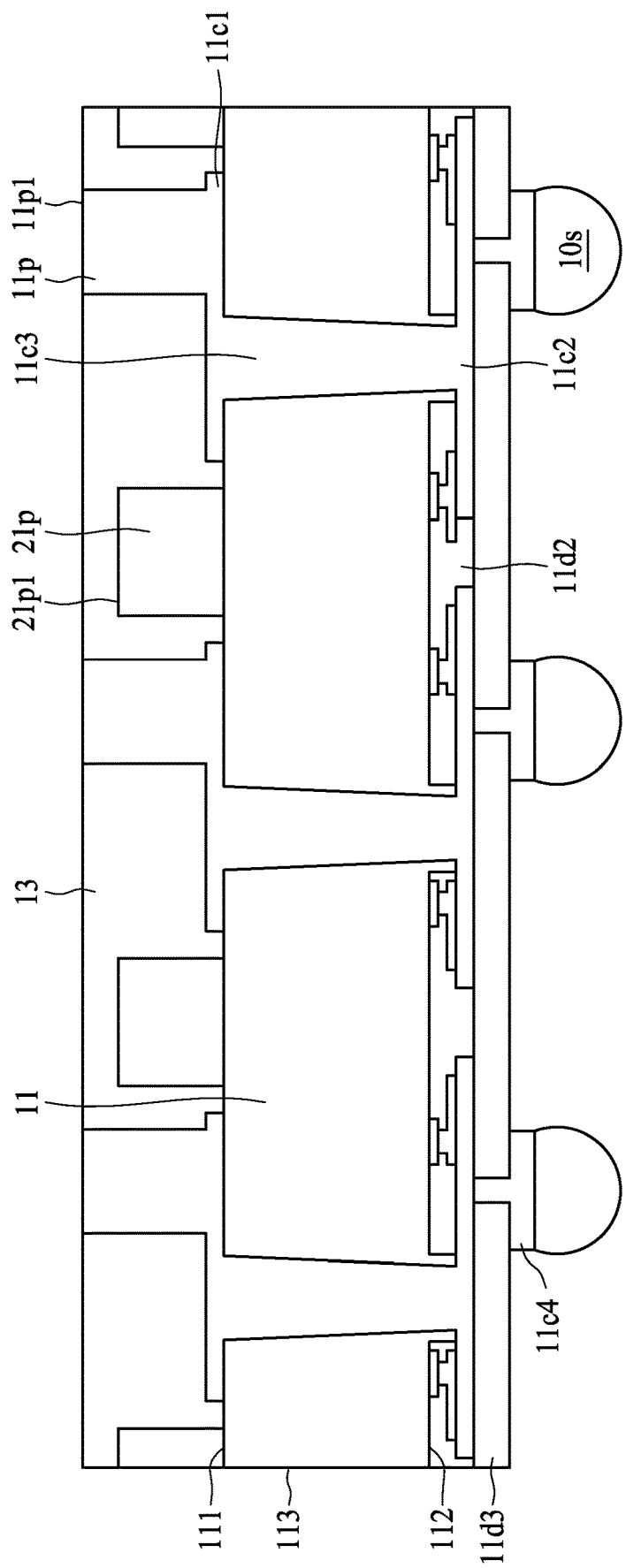

FIG. 3C illustrates a cross-sectional view of a semiconductor structure in accordance with some embodiments of the present disclosure. In some embodiments, the semiconductor structure illustrated in FIG. 3C may be implemented or used for the semiconductor device package 3 as shown in FIG. 3A. For example, a portion of the semiconductor device package 3 encircled by a dotted-line square 3A as shown in FIG. 3A may be replaced by the semiconductor structure as shown in FIG. 3C. The semiconductor structure as shown in FIG. 3C is similar to the portion of the semiconductor device package 3 encircled by a dotted-line square 3A as shown in FIG. 3A, except that as shown in FIG. 3C, the through hole 11v is fully filled with the conductive via 11c3.

Figure 3D:
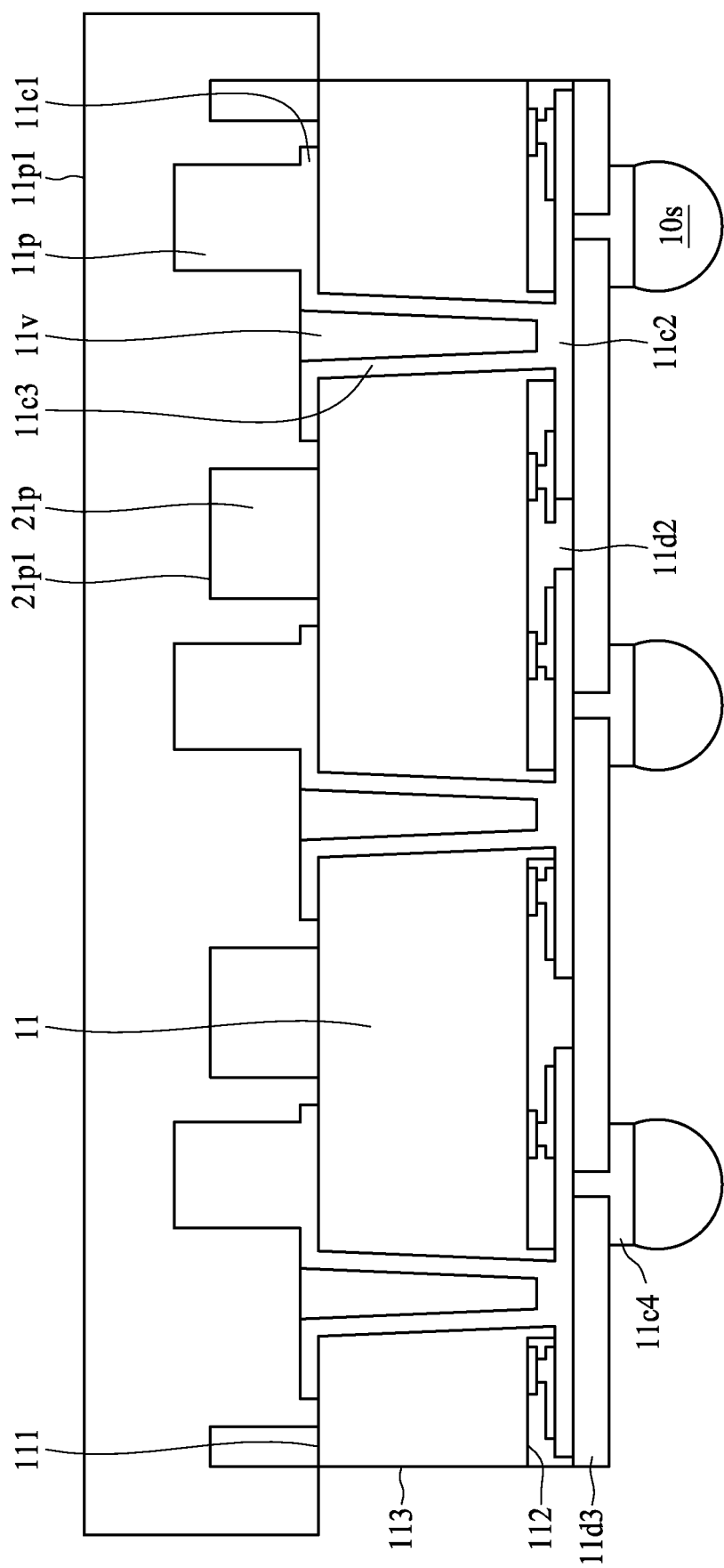

FIG. 3D illustrates a cross-sectional view of a semiconductor structure in accordance with some embodiments of the present disclosure. In some embodiments, the semiconductor structure illustrated in FIG. 3D may be implemented or used for the semiconductor device package 3 as shown in FIG. 3A. For example, a portion of the semiconductor device package 3 encircled by a dotted-line square 3A as shown in FIG. 3A may be replaced by the semiconductor structure as shown in FIG. 3D. The semiconductor structure as shown in FIG. 3D is similar to the portion of the semiconductor device package 3 encircled by a dotted-line square 3A as shown in FIG. 3A, and some of the differences therebetween are described below.

As shown in FIG. 3D, a portion of the electronic component 11 at or near the periphery of the electronic component 11 is removed. A lateral surface 113 of the electronic component 11 is recessed from the lateral surface of the reinforcement layer 21p. For example, a width (or an area) of the reinforcement layer 21p is greater than a width (or an area) of the electronic component 11. In some embodiments, the portion of the electronic component 11 may be removed by, for example, plasma, etching, laser or any other suitable operations. Since the portion of the electronic component 11 is at or near the cutting channel (or scribe line), removing the portion of the electronic component 11 allows that the cutting operation (or singulation operation) is carried out merely through the package body 13, which can prevent the electronic component 11 from being damaged (e.g., crack) during the singulation operation.

Figure 3E:
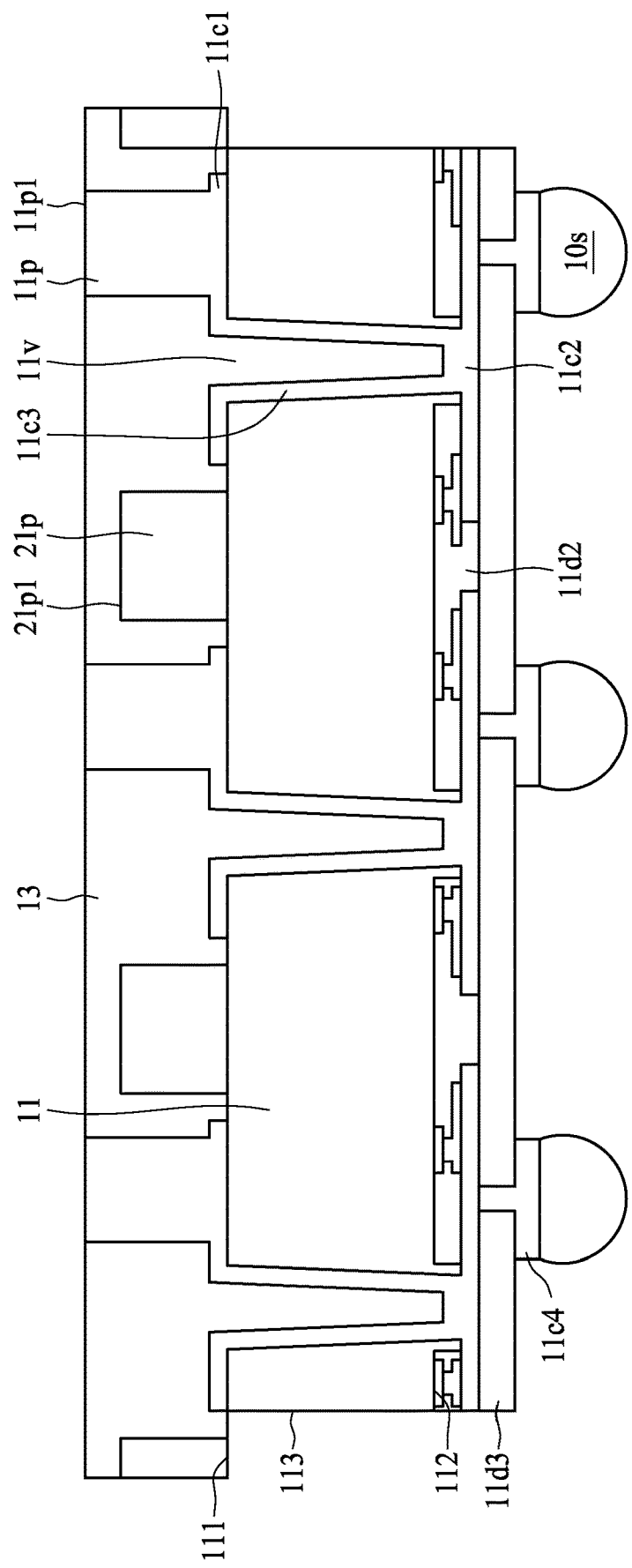

FIG. 3E illustrates a cross-sectional view of a semiconductor structure in accordance with some embodiments of the present disclosure. In some embodiments, the semiconductor structure illustrated in FIG. 3E may be implemented or used for the semiconductor device package 3 as shown in FIG. 3A. For example, a portion of the semiconductor device package 3 encircled by a dotted-line square 3A as shown in FIG. 3A may be replaced by the semiconductor structure as shown in FIG. 3E. The semiconductor structure as shown in FIG. 3E is similar to the semiconductor structure as shown in FIG. 3B, except that as shown in FIG. 3E, a portion of the electronic component 11 at or near the periphery of the electronic component 11 is removed.

Figure 3F:
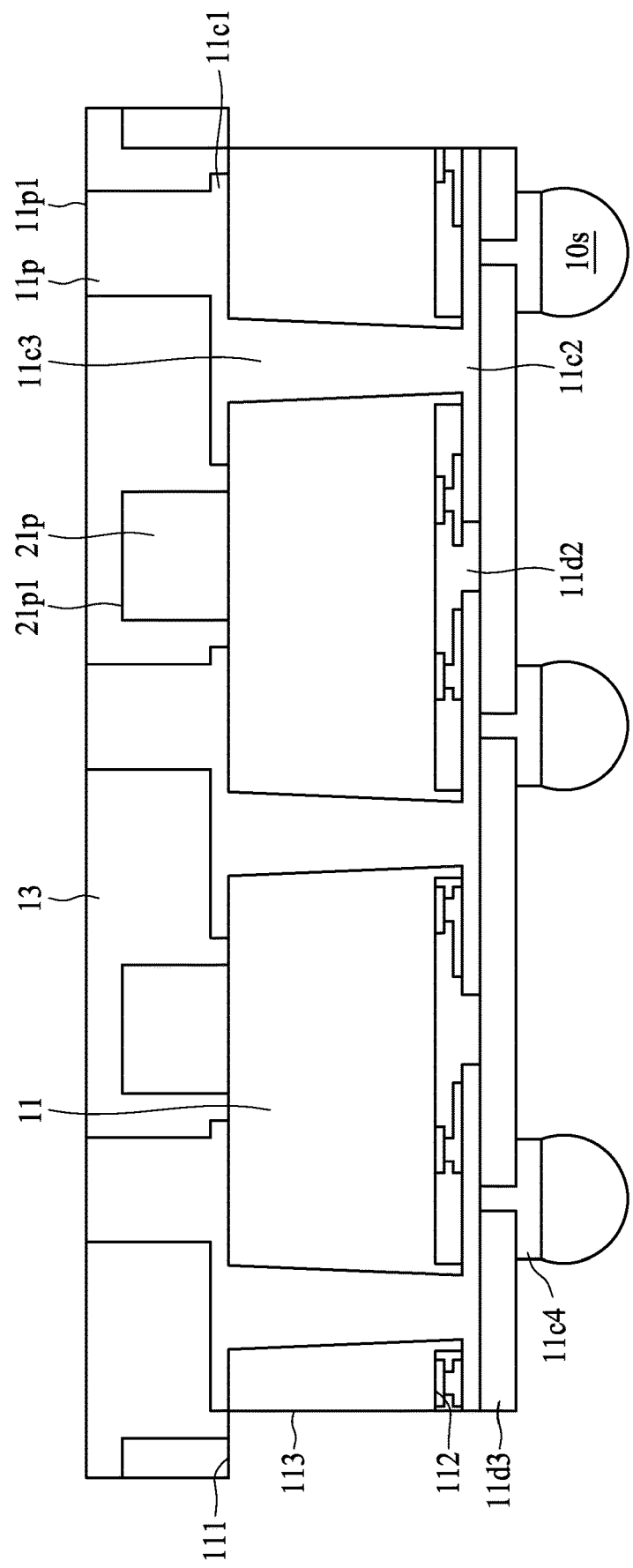

FIG. 3F illustrates a cross-sectional view of a semiconductor structure in accordance with some embodiments of the present disclosure. In some embodiments, the semiconductor structure illustrated in FIG. 3F may be implemented or used for the semiconductor device package 3 as shown in FIG. 3A. For example, a portion of the semiconductor device package 3 encircled by a dotted-line square 3A as shown in FIG. 3A may be replaced by the semiconductor structure as shown in FIG. 3F. The semiconductor structure as shown in FIG. 3F is similar to the semiconductor structure as shown in FIG. 3C, except that as shown in FIG. 3F, a portion of the electronic component 11 at or near the periphery of the electronic component 11 is removed.

Figure 3G:
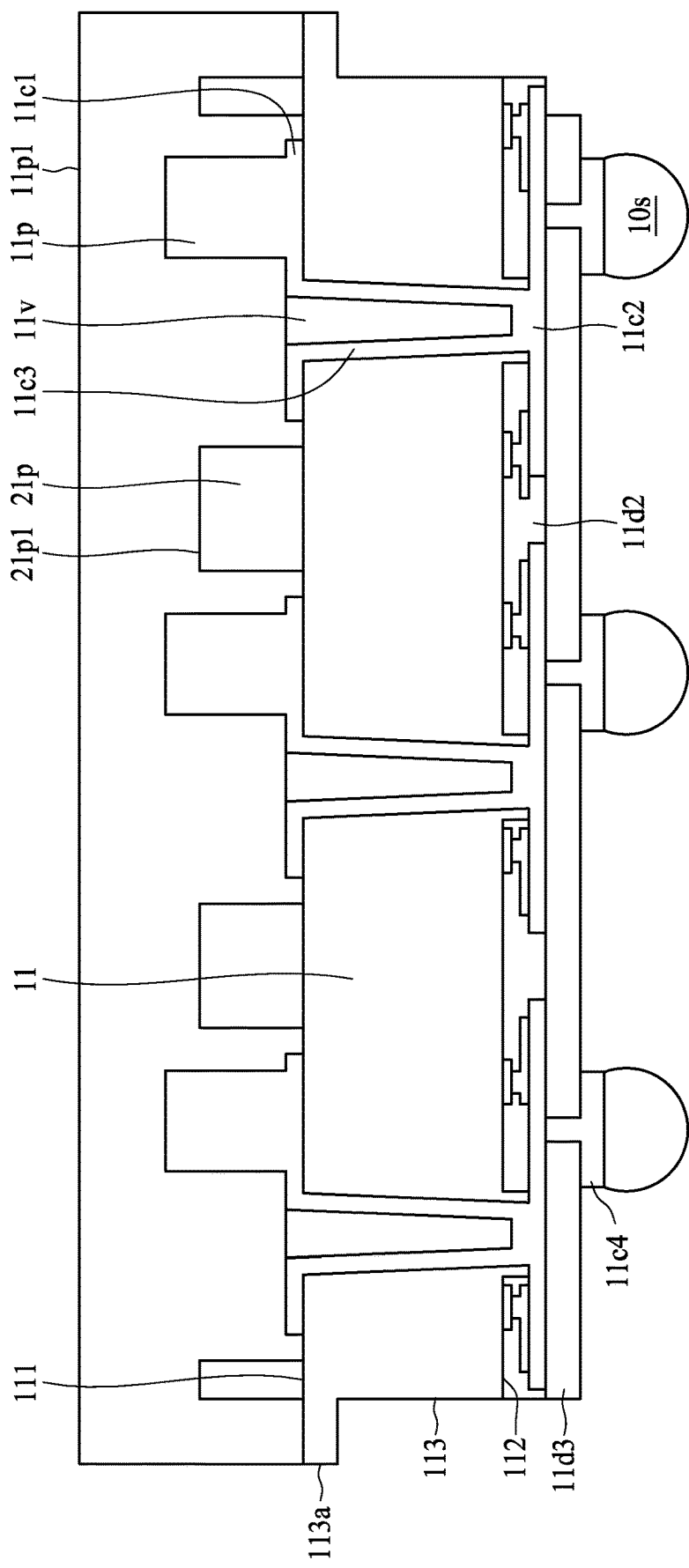

FIG. 3G illustrates a cross-sectional view of a semiconductor structure in accordance with some embodiments of the present disclosure. In some embodiments, the semiconductor structure illustrated in FIG. 3G may be implemented or used for the semiconductor device package 3 as shown in FIG. 3A. For example, a portion of the semiconductor device package 3 encircled by a dotted-line square 3A as shown in FIG. 3A may be replaced by the semiconductor structure as shown in FIG. 3G. The semiconductor structure as shown in FIG. 3G is similar to the semiconductor structure as shown in FIG. 3D, except that as shown in FIG. 3G, a portion of the electronic component 11 at or near the top surface 111 of the electronic component 11 remains. For example, the electronic component 11 has a lateral surface 113a and a lateral surface 113 recessed from the lateral surface 113a.

Figure 3H:
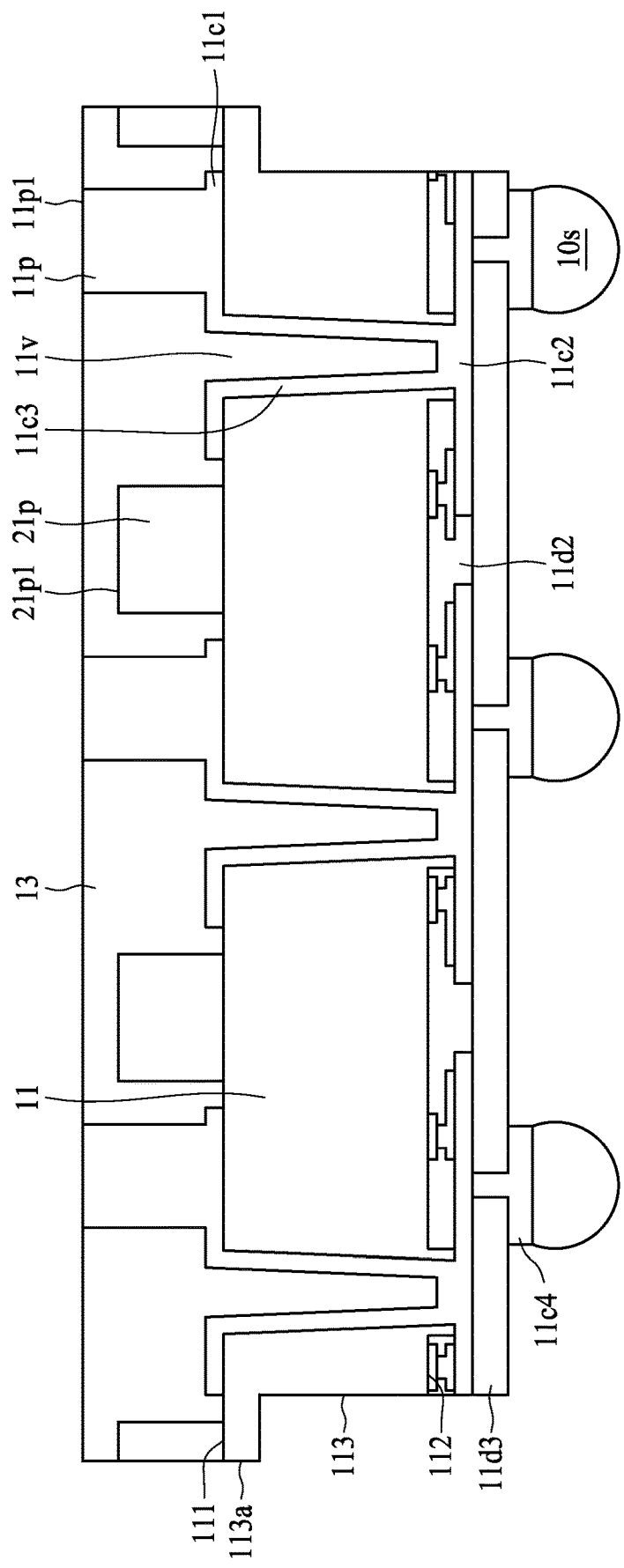

FIG. 3H illustrates a cross-sectional view of a semiconductor structure in accordance with some embodiments of the present disclosure. In some embodiments, the semiconductor structure illustrated in FIG. 3H may be implemented or used for the semiconductor device package 3 as shown in FIG. 3A. For example, a portion of the semiconductor device package 3 encircled by a dotted-line square 3A as shown in FIG. 3A may be replaced by the semiconductor structure as shown in FIG. 3H. The semiconductor structure as shown in FIG. 3H is similar to the semiconductor structure as shown in FIG. 3E, except that as shown in FIG. 3H, a portion of the electronic component 11 at or near the top surface 111 of the electronic component 11 remains.

Figure 3I:
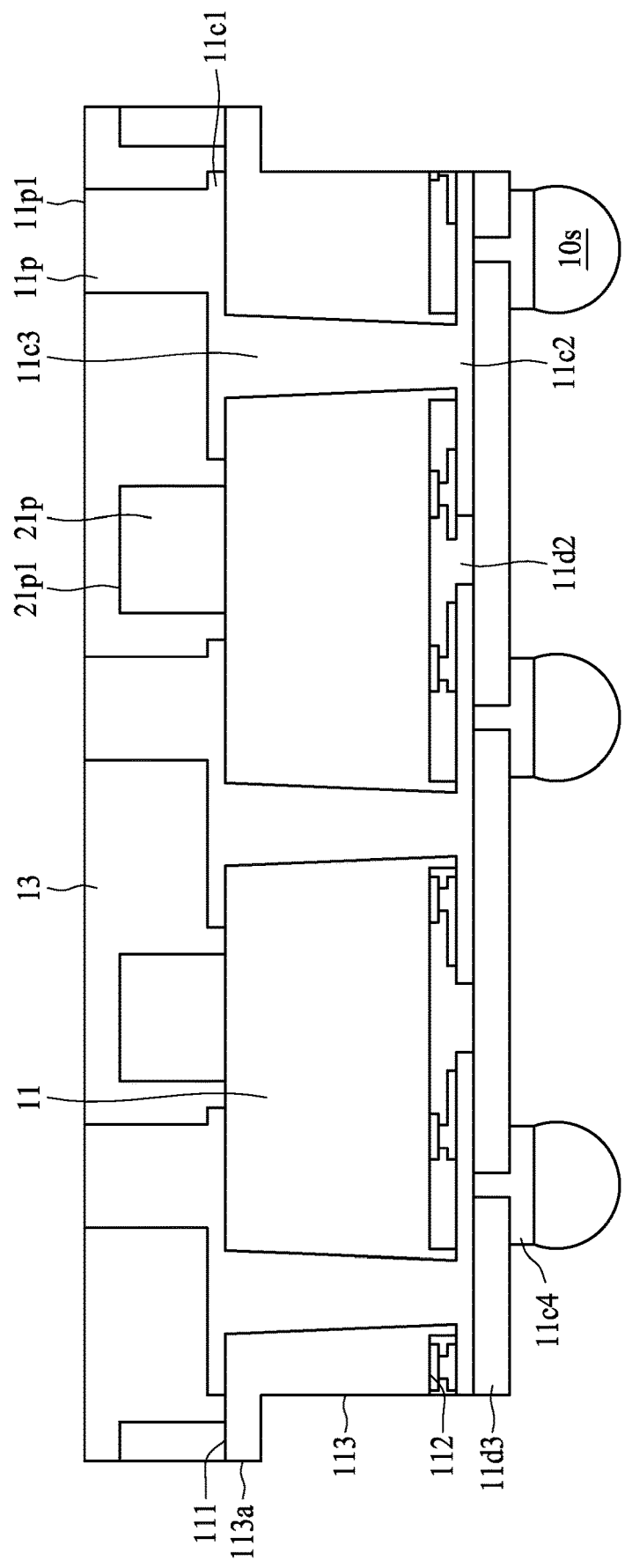

FIG. 3I illustrates a cross-sectional view of a semiconductor structure in accordance with some embodiments of the present disclosure. In some embodiments, the semiconductor structure illustrated in FIG. 3I may be implemented or used for the semiconductor device package 3 as shown in FIG. 3A. For example, a portion of the semiconductor device package 3 encircled by a dotted-line square 3A as shown in FIG. 3A may be replaced by the semiconductor structure as shown in FIG. 3I. The semiconductor structure as shown in FIG. 3I is similar to the semiconductor structure as shown in FIG. 3F, except that as shown in FIG. 3I, a portion of the electronic component 11 at or near the top surface 111 of the electronic component 11 remains.

FIG. 4A, FIG. 4B, FIG. 4C, FIG. 4D, FIG. 4E and FIG. 4F illustrate a method for manufacturing a semiconductor device package in accordance with some embodiments of the present disclosure. In some embodiments, the method illustrated in FIG. 4A, FIG. 4B, FIG. 4C, FIG. 4D, FIG. 4E and FIG. 4F are used to manufacture the semiconductor device package 1 as shown in FIG. 1A. Alternatively, the method illustrated in FIG. 4A, FIG. 4B, FIG. 4C, FIG. 4D, FIG. 4E and FIG. 4F can be used to manufacture other semiconductor device packages.

Figure 4A:
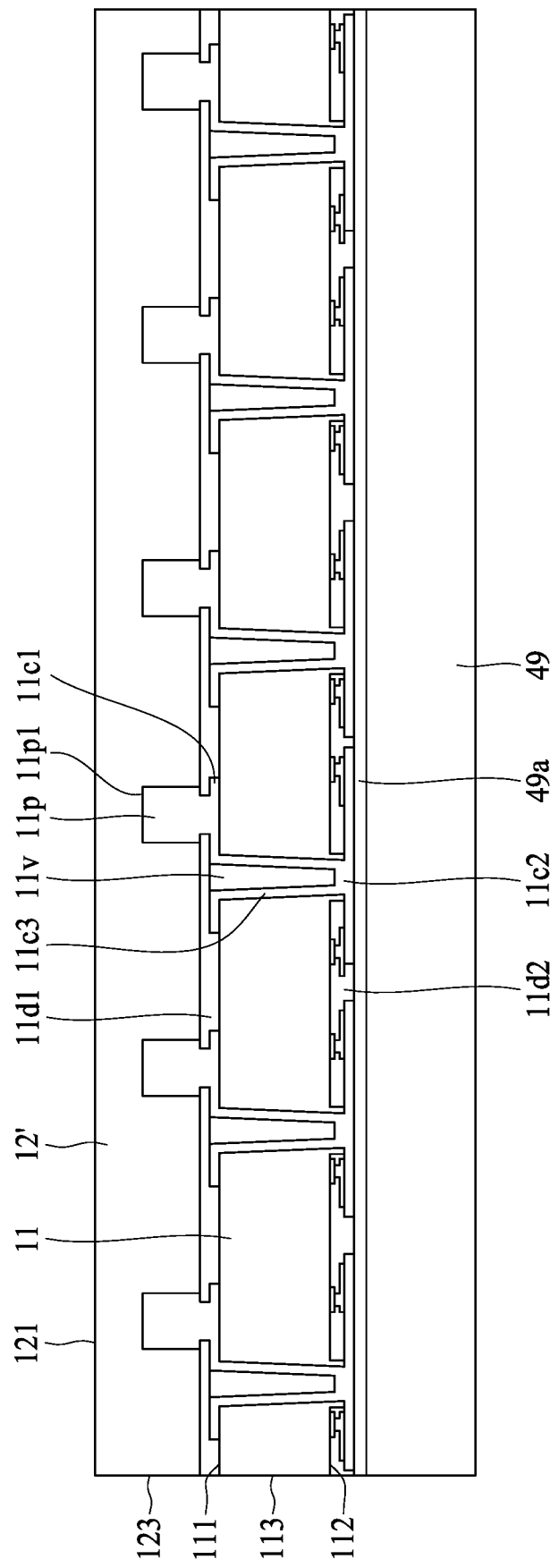
FIG. 4A, FIG. 4B, FIG. 4C, FIG. 4D, FIG. 4E, and FIG. 4F illustrate one or more stages of an example of a method for manufacturing a semiconductor device package in accordance with some embodiments of the present disclosure.

Referring to FIG. 4A, a carrier 49 is provided. The carrier 49 may have an adhesive layer 49a disposed thereon. A plurality of electronic components including the electronic component 11 are disposed on the carrier 49. In some embodiments, the electronic component 11 may be in a wafer type, a panel type or a strip type. In some embodiments, prior to disposing the electronic component 11 on the carrier 49, a thinning operation may be performed to the electronic component 11 to reduce the thickness of the electronic component 11. After the thinning operation, the thickness of the electronic component 11 is less than 100 micrometers. Then one or more through holes 11v may be formed to penetrate the electronic component 11.

Still referring to FIG. 4A, electrical contacts 11p are disposed on the surface 111 of the electronic component 11. The electrical contacts 11p are electrically connected to the conductive layer 11c1 of the electronic component 11. The reinforcement layer 12' is formed on the surface 111 of the electronic component 11 to fully cover the electrical contacts 11p. In some embodiments, the reinforcement layer 12' may be formed by, for example, molding or any other suitable techniques.

Figure 4B:
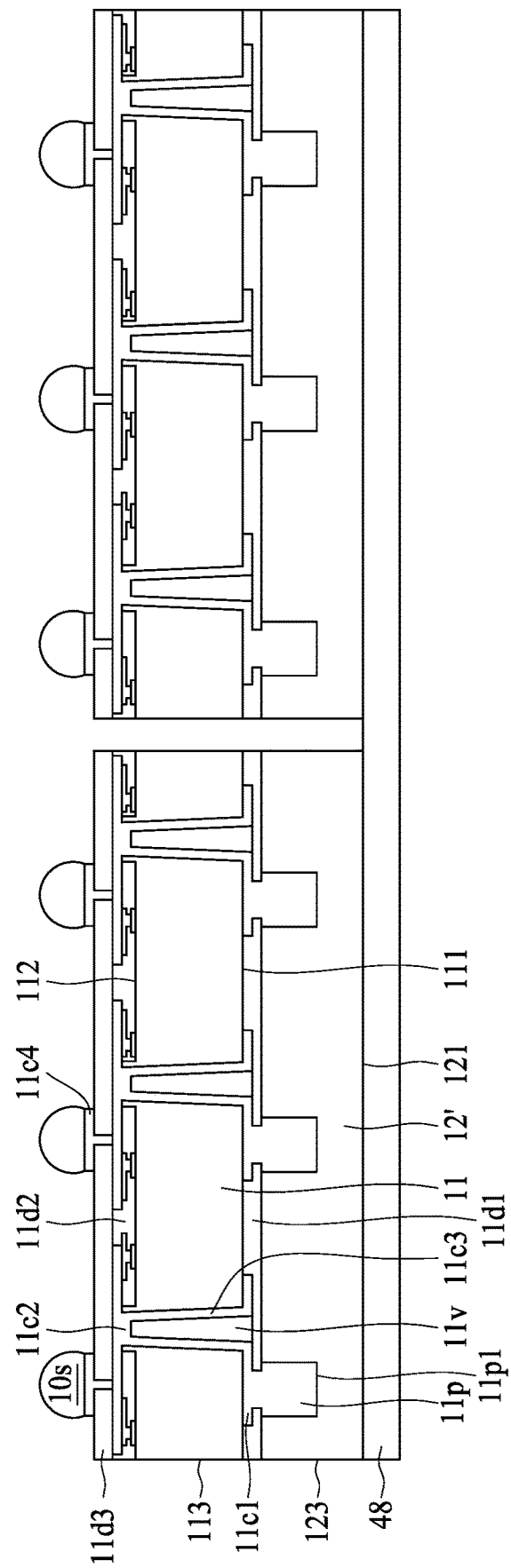

Referring to FIG. 4B, the carrier 49 and the adhesive layer 49a are removed to expose the conductive layer 11c2 and the dielectric layer 11d2 of the electronic component 11. The reinforcement layer 12' is disposed on a carrier 48 (or a tape). Electrical contacts 10s (e.g., C4 bumps) are formed on the surface 112 of the electronic component 11 and electrically connected to the conductive layer 11c2. Then, singulation may be performed to separate out individual electronic components including the electronic component 11. That is, the singulation is performed through the electronic components including the electronic component 11 and the reinforcement layer 12'. The singulation may be performed, for example, by using a dicing saw, laser or other appropriate cutting technique.

Figure 4C:
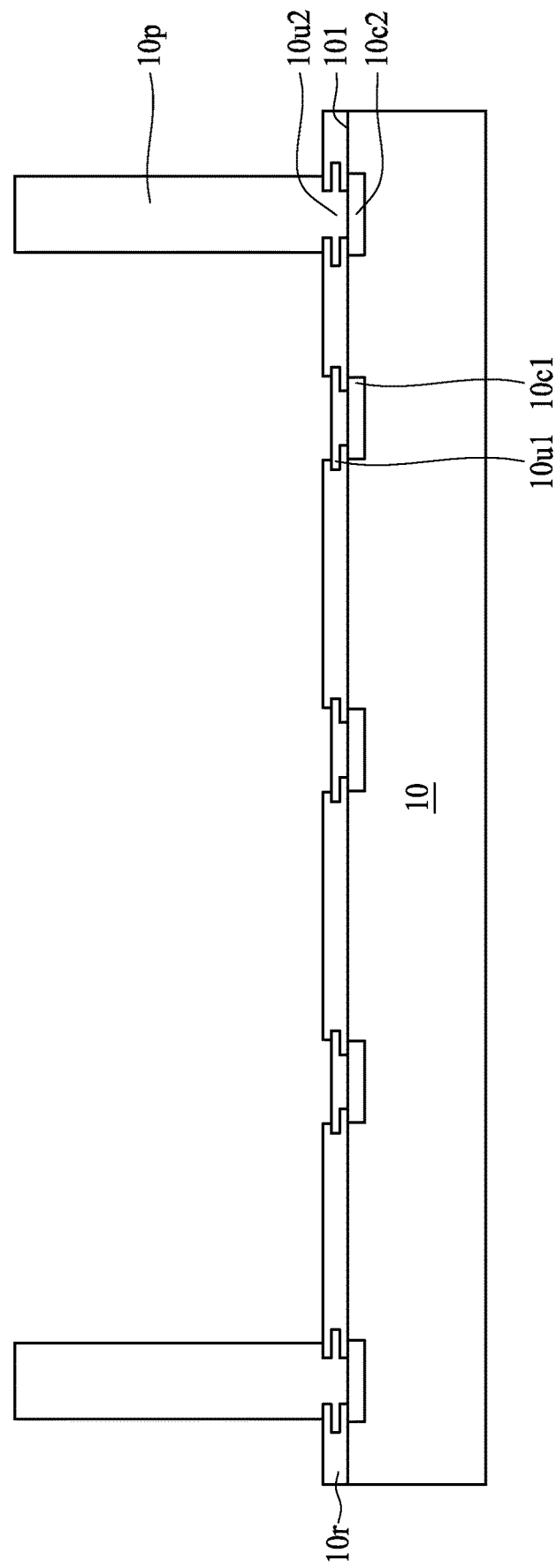

Referring to FIG. 4C, a plurality of electronic components including the electronic component 10 are provided. In some embodiments, the electronic component 10 may be in a wafer type, a panel type or a strip type. The conductive pillars 10p are disposed on the active surface 101 of the electronic component 10 and electrically connected to the conductive pads 10c2 of the electronic component 10.

Figure 4D:
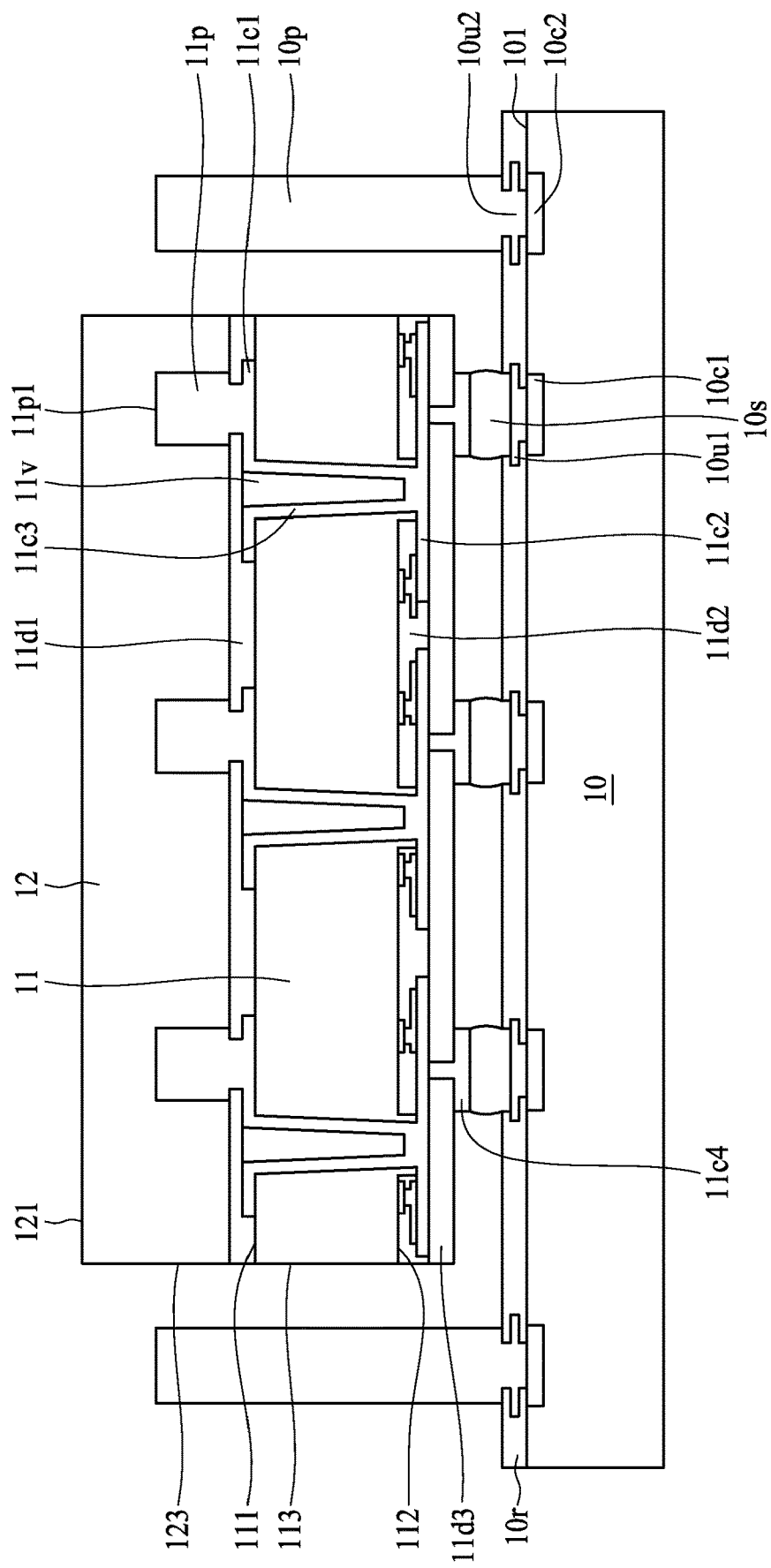

Referring to FIG. 4D, the electronic component 11 is disposed on the active surface 101 of the electronic component 10. The electronic component 11 is connected to the conductive pads 10c1 of the electronic component 10 through the electrical contacts 10s. In some embodiments, the electronic component 11 may be connected to the electronic component 10 by, for example, flip-chip or any other suitable processes.

In some embodiments, after the singulation operation as shown in FIG. 4B, each individual electronic component 11 may be lifted up, and the lifted electronic component 11 is then picked up and placed on the active surface 101 of the electronic component 10. In the case that the reinforcement layer 12' is omitted, the structural strength of the electronic component 11 may be relative weak, and the force or stress applied to the electronic component 11 during the lift-up operation and pick-and-place operation may damage the electronic component 11. In accordance with the embodiments as shown in FIGS. 4A and 4B, the reinforcement layer 12' is formed on the surface 111 of the electronic component 11, which may act as a stress buffer layer for the electronic component 11. For example, the stress applied to the electronic component 11 and/or the electrical contacts 11p during the lift-up operation and pick-and-place operation may be absorbed, relieved or dispersed by the reinforcement layer 12'. This can prevent the electronic component 11 from being damaged during the manufacturing process and increase the yield for manufacturing the semiconductor device package.

Figure 4E:
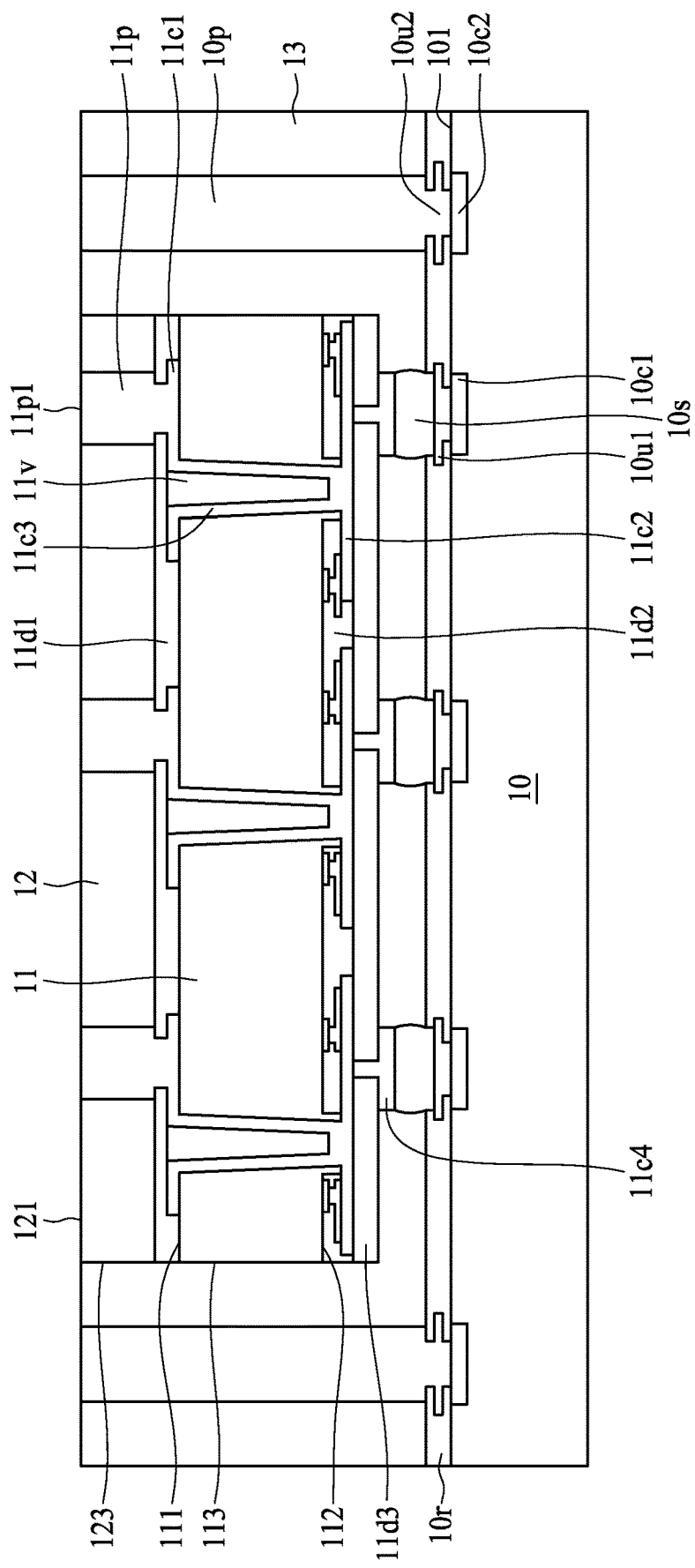

Referring to FIG. 4E, the package body 13 is formed on the active surface 101 of the electronic component 10 to cover the electronic component 11, the reinforcement layer 12' and the conductive pillars 10p. In some embodiments, the package body 13 may be formed by, for example, molding or any other suitable processes. Then, a portion of the reinforcement layer 12' and the package body 13 is removed by, for example, grinding or other suitable processes to expose the top surfaces of the electrical contacts 11p and the conductive pillars 10p.

Figure 4F:
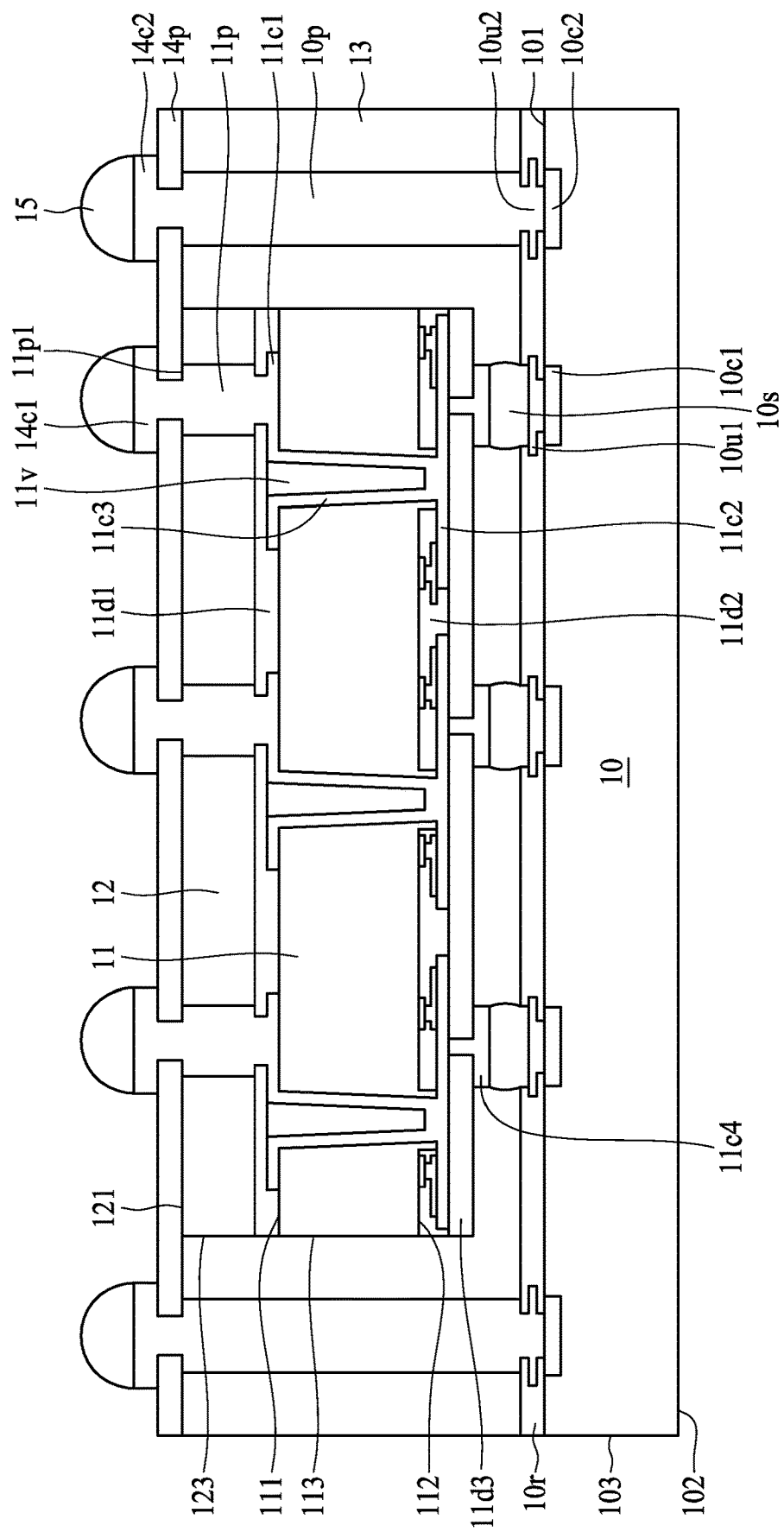

Referring to FIG. 4F, the conductive layers 14c1, 14c2 are formed to be electrically connected to the exposed portion of the electrical contacts 11p and the conductive pillars 10p respectively. The dielectric layer 14d may be formed to cover a portion of the conductive layers 14c1, 14c2 and to expose the other portion of the conductive layers 14c1, 14c2 for electrical connections. The electrical contacts 15 (e.g., C4 bumps) are then disposed on the exposed portion of the conductive layers 14c1, 14c2 to form the semiconductor device package 1 as shown in FIG. 1A.

FIG. 5A, FIG. 5B, FIG. 5C, FIG. 5D, FIG. 5E and FIG. 5F illustrate a method for manufacturing a semiconductor device package in accordance with some embodiments of the present disclosure. In some embodiments, the method illustrated in FIG. 5A, FIG. 5B, FIG. 5C, FIG. 5D, FIG. 5E and FIG. 5F are used to manufacture the semiconductor device package 2 as shown in FIG. 2. Alternatively, the method illustrated in FIG. 5A, FIG. 5B, FIG. 5C, FIG. 5D, FIG. 5E and FIG. 5F can be used to manufacture other semiconductor device packages.

Figure 5A:
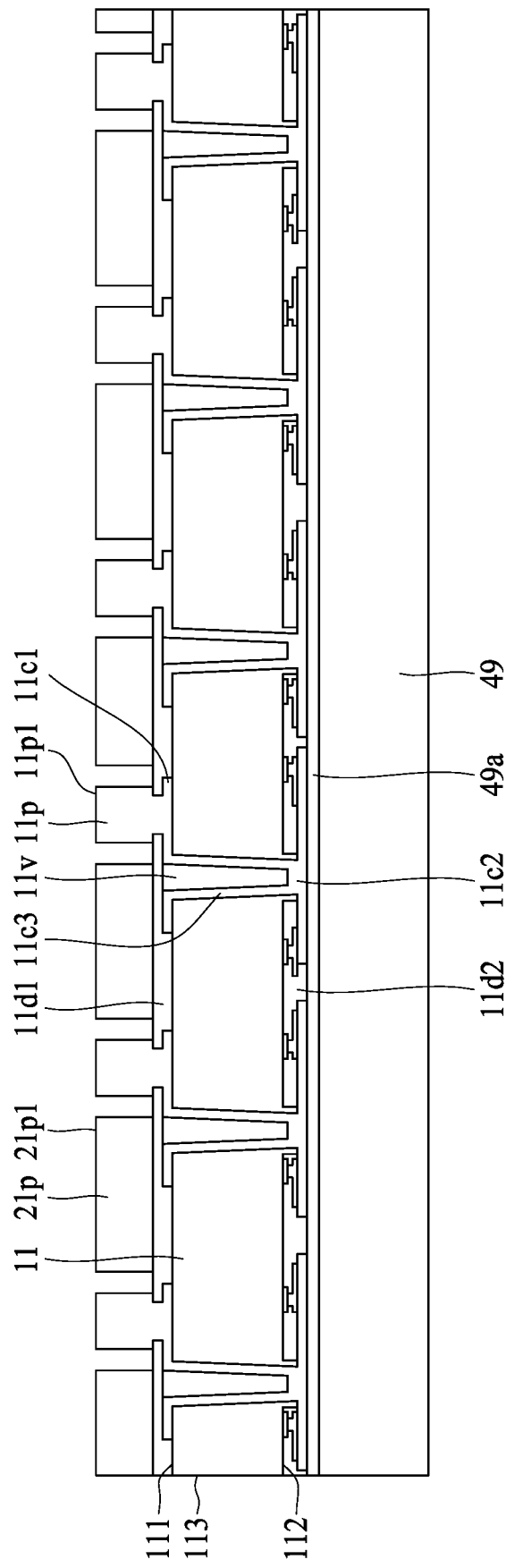
FIG. 5A, FIG. 5B, FIG. 5C, FIG. 5D, FIG. 5E, and FIG. 5F illustrate one or more stages of an example of a method for manufacturing a semiconductor device package in accordance with some embodiments of the present disclosure.

Referring to FIG. 5A, a carrier 49 is provided. The carrier 49 may have an adhesive layer 49a disposed thereon. A plurality of electronic components including the electronic component 11 are disposed on the carrier 49. In some embodiments, the electronic component 11 may be in a wafer type, a panel type or a strip type. In some embodiments, prior to disposing the electronic component 11 on the carrier 49, a thinning operation may be performed to the electronic component 11 to reduce the thickness of the electronic component 11. After the thinning operation, the thickness of the electronic component 11 is less than 100 micrometers. Then one or more through holes 11v may be formed to penetrate the electronic component 11.

Still referring to FIG. 5A, electrical contacts 11p are disposed on the surface 111 of the electronic component 11. The electrical contacts 11p are electrically connected to the conductive layer 11c1 of the electronic component 11. The reinforcement layer 21p (e.g., metal layer) is formed on the surface 111 of the electronic component 11. In some embodiments, the electrical contacts 11p and the reinforcement layer 21p may be formed in a single operation by, for example, plating or any other suitable processes. The reinforcement layer 21p is spaced apart from (or isolated from) the electrical contacts 11p. For example, there is a gap between the electrical contacts 11p and the reinforcement layer 21p.

Figure 5B:
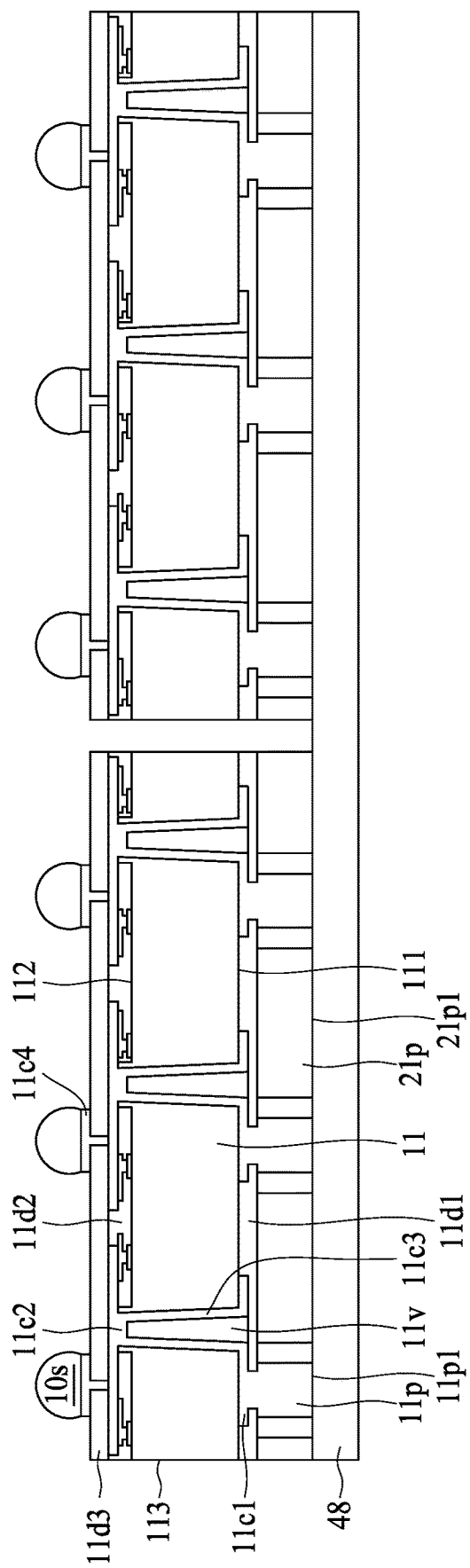

Referring to FIG. 5B, the carrier 49 and the adhesive layer 49a are removed to expose the conductive layer 11c2 and the dielectric layer 11d2 of the electronic component 11. The reinforcement layer 21p and the electrical contacts 11p are disposed on a carrier 48 (or a tape). Electrical contacts 10s (e.g., C4 bumps) are formed on the surface 112 of the electronic component 11 and electrically connected to the conductive layer 11c2. Then, singulation may be performed to separate out individual electronic components including the electronic component 11. That is, the singulation is performed through the electronic components including the electronic component 11 and the reinforcement layer 21p. The singulation may be performed, for example, by using a dicing saw, laser or other appropriate cutting technique.

Figure 5C:
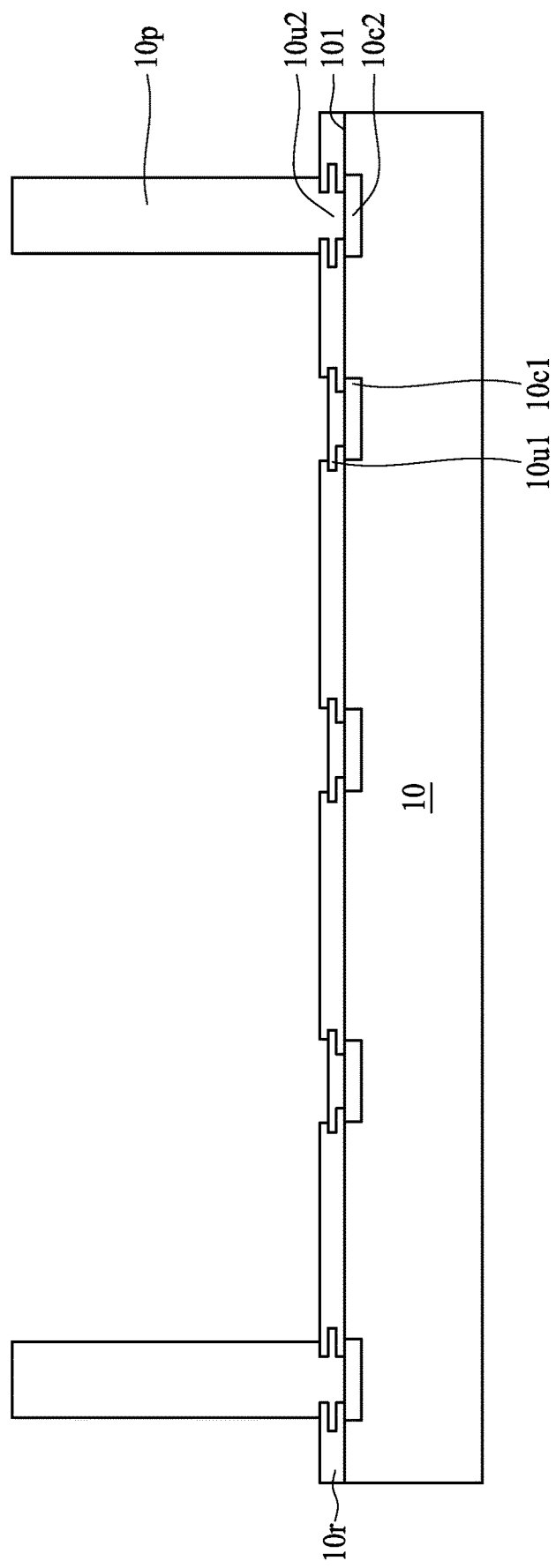

Referring to FIG. 5C, a plurality of electronic components including the electronic component 10 are provided. In some embodiments, the electronic component 10 may be in a wafer type, a panel type or a strip type. The conductive pillars 10p are disposed on the active surface 101 of the electronic component 10 and electrically connected to the conductive pads 10c2 of the electronic component 10.

Figure 5D:
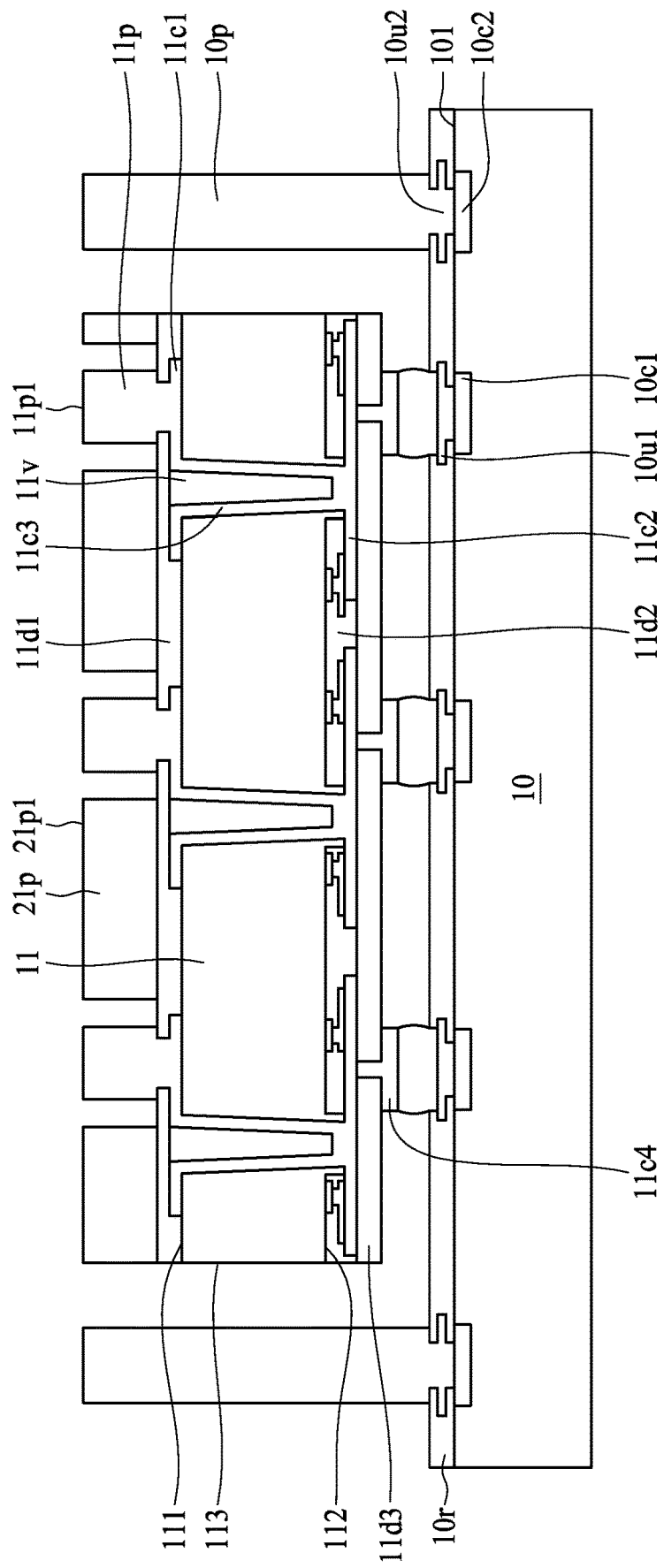

Referring to FIG. 5D, the electronic component 11 is disposed on the active surface 101 of the electronic component 10. The electronic component 11 is connected to the conductive pads 10c1 of the electronic component 10 through the electrical contacts 10s. In some embodiments, the electronic component 11 may be connected to the electronic component 10 by, for example, flip-chip or any other suitable processes.

In some embodiments, after the singulation operation as shown in FIG. 5B, each individual electronic component 11 may be lifted up, and the lifted electronic component 11 is then picked up and placed on the active surface 101 of the electronic component 10. In the case that the reinforcement layer 21p is omitted, the structural strength of the electronic component 11 may be relative weak, and the force or stress applied to the electronic component 11 during the lift-up operation and pick-and-place operation may damage the electronic component 11. In accordance with the embodiments as shown in FIGS. 5A and 5B, the reinforcement layer 21p is formed on the surface 111 of the electronic component 11, which may act as a stress buffer layer for the electronic component 11. For example, the stress applied to the electronic component 11 and/or the electrical contacts 11p during the lift-up operation and pick-and-place operation may be absorbed, relieved or dispersed by the reinforcement layer 21p. This can prevent the electronic component 11 from being damaged during the manufacturing process and increase the yield for manufacturing the semiconductor device package.

Figure 5E:
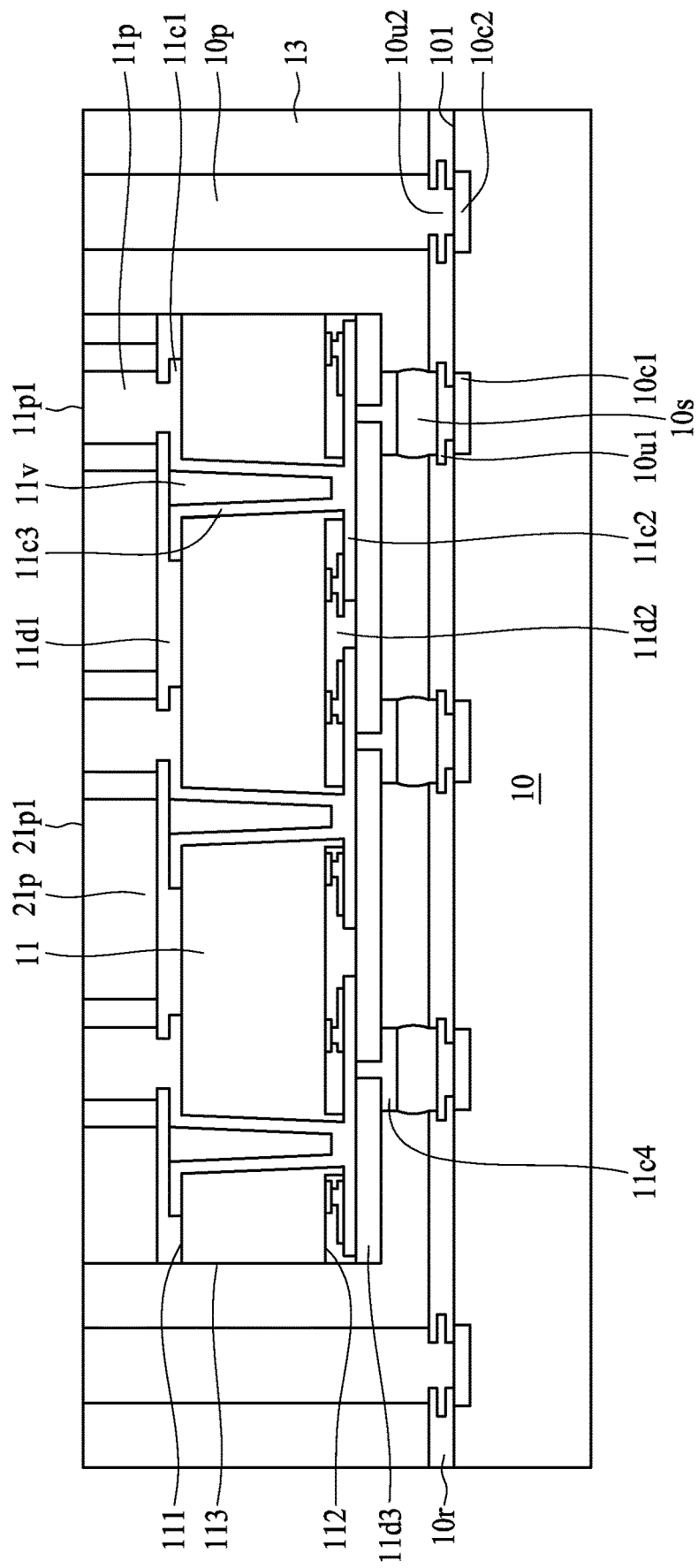

Referring to FIG. 5E, the package body 13 is formed on the active surface 101 of the electronic component 10 to cover the electronic component 11, the reinforcement layer 21p and the conductive pillars 10p. The package body 13 is further disposed within the gap between the reinforcement layer 21p and the electrical contacts 11p. In some embodiments, the package body 13 may be formed by, for example, molding or any other suitable processes. Then, a portion of the package body 13 is removed by, for example, grinding or other suitable processes to expose the top surfaces of the electrical contacts 11p, the conductive pillars 10p and the reinforcement layer 21p.

Figure 5F:
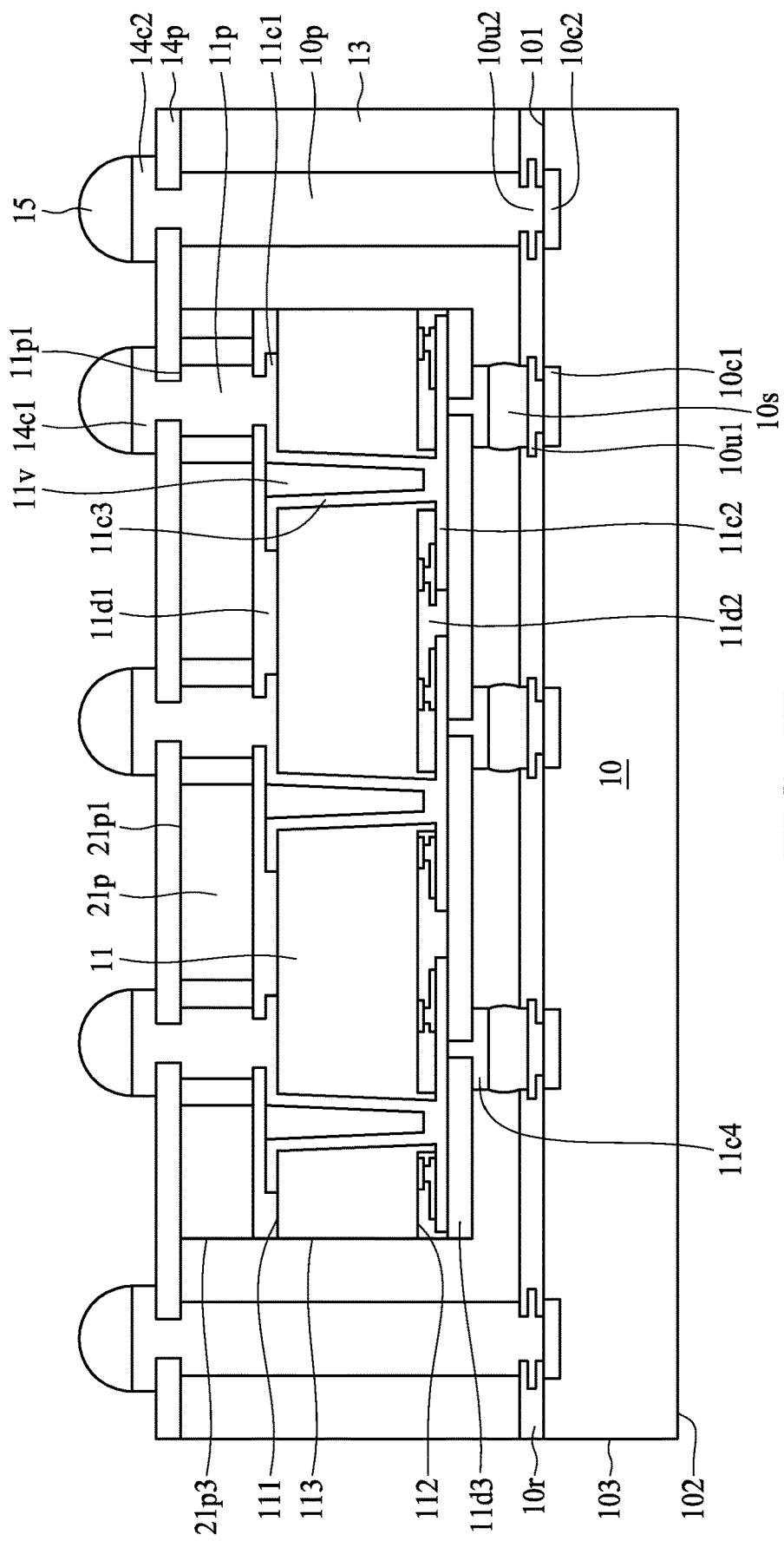

Referring to FIG. 5F, the conductive layers 14c1, 14c2 are formed to be electrically connected to the exposed portion of the electrical contacts 11p and the conductive pillars 10p respectively. The dielectric layer 14d may be formed to cover a portion of the conductive layers 14c1, 14c2 and to expose the other portion of the conductive layers 14c1, 14c2 for electrical connections. The electrical contacts 15 (e.g., C4 bumps) are then disposed on the exposed portion of the conductive layers 14c1, 14c2 to form the semiconductor device package 2 as shown in FIG. 2.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
   a first electronic component;
   an electrical contact disposed over the first electronic component;
   a reinforcement layer encapsulating a side surface of the electrical contact and configured to prevent the first electronic component from being damaged, wherein a top surface of the electrical contact is exposed from the reinforcement layer and is substantially level with a top surface of the reinforcement layer;
   a dielectric layer covering a first region of the top surface of the electrical contact; and
   a first conductive layer covering a second region of the top surface of the electrical contact and electrically connecting to the electrical contact.

2. The semiconductor device package of claim 1, further comprising a second electronic component disposed over the first electronic component and configured to provide a powering path between the first electronic component and the second electronic component.

3. The semiconductor device package of claim 2, wherein the powering path is through a soldering material between the first electronic component and the second electronic component.

4. The semiconductor device package of claim 3, further comprising a package body encapsulating the soldering material.

5. The semiconductor device package of claim 1, further comprising a protection layer and a conductive element, wherein the protection layer has an opening, and the conductive element comprises a first portion within the opening and a second portion extending along a lateral side of the first electronic component.

6. The semiconductor device package of claim 1, further comprising:
   a conductive element extending along a lateral side of the first electronic component;
   a soldering material at a side of the first electronic component opposite to the reinforcement layer; and
   a package body encapsulating the first electronic component, the conductive element, and the soldering material.

7. The semiconductor device package of claim 1, further comprising a soldering material over the first conductive layer.

8. The semiconductor device package of claim 1, further comprising:
   a conductive element extending along a lateral side of the first electronic component, wherein the dielectric layer covers a first region of a top surface of the conductive element; and
   a second conductive layer covering a second region of the top surface of the conductive element and electrically connecting to the conductive element.

9. A semiconductor device package, comprising:
   a first electronic component;
   a second electronic component configured to power the first electronic component and disposed under the first electronic component;
   a first soldering material;
   a reinforcement layer, wherein the reinforcement layer and the first soldering material are both located over a first surface of the second electronic component;
   a conductive element extending along a lateral side of the second electronic component, wherein the conductive element is disposed under the first electronic component; and
   a dielectric layer and a first conductive layer under the conductive element, wherein the first conductive layer is exposed from the dielectric layer and connected to the conductive element.

10. The semiconductor device package of claim 9, further comprising an electrical contact disposed over the first surface of the second electronic component and electrically connected to the first soldering material, wherein the reinforcement layer encapsulates the electrical contact.

11. The semiconductor device package of claim 9, further comprising a second conductive layer and a protection layer at least partially over the conductive element, wherein the second conductive layer comprises an exposed portion exposed from the protection layer, and a width of the exposed portion is less than a maximum width of the conductive element.

12. A semiconductor device package, comprising:
   a first electronic component;
   a second electronic component configured to power the first electronic component and disposed under the first electronic component;
   a first soldering material;
   a reinforcement layer, wherein the reinforcement layer and the first soldering material are both located over a first surface of the second electronic component; and
   a conductive element extending along a lateral side of the second electronic component;
   a second soldering material disposed between the first electronic component and the second electronic component; and
   a dielectric layer and a conductive via penetrating through the dielectric layer, wherein the conductive via is at least partially under the second soldering material and electrically connected to the second electronic component.

13. The semiconductor device package of claim 12, wherein the first soldering material at least partially overlaps the second soldering material vertically.

14. The semiconductor device package of claim 12, wherein a width of the first soldering material is greater than a width of the second soldering material.

* * * * *